(12) United States Patent
Kim et al.

(10) Patent No.: US 10,804,103 B2
(45) Date of Patent: Oct. 13, 2020

(54) MICROASSEMBLY OF HETEROGENEOUS MATERIALS

(71) Applicant: The Board of Trustees of the University of Illinois, Urbana, IL (US)

(72) Inventors: Seok Kim, Champaign, IL (US); Zining Yang, Urbana, IL (US); Hohyun Keum, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 120 days.

(21) Appl. No.: 16/024,123

(22) Filed: Jun. 29, 2018

(65) Prior Publication Data

US 2019/0006180 A1  Jan. 3, 2019

Related U.S. Application Data

(60) Provisional application No. 62/528,246, filed on Jul. 3, 2017.

(51) Int. Cl.
*H01L 21/033* (2006.01)
*B41K 3/54* (2006.01)
(Continued)

(52) U.S. Cl.
CPC ............ *H01L 21/0337* (2013.01); *B41K 3/04* (2013.01); *B41K 3/24* (2013.01); *B41K 3/54* (2013.01); *B41K 3/56* (2013.01); *B41K 3/62* (2013.01); *C09D 11/103* (2013.01); *H01L 21/3065* (2013.01); *H01L 21/31144* (2013.01)

(58) Field of Classification Search
CPC ............. H01L 21/0337; H01L 21/3065; H01L 21/31144; B41K 3/04; B41K 3/24; B41K 3/54; B41K 3/56; B41K 3/62; C09D 11/103
See application file for complete search history.

(56) References Cited

U.S. PATENT DOCUMENTS 6,245,249 B1 * 6/2001 Yamada ................ B81C 99/008
216/33
8,057,891 B2 11/2011 Cheng et al.
(Continued)

OTHER PUBLICATIONS

A. del Campo and C. Greiner, "Topical Review—SU-8: a photoresist for high-aspect-ratio and 3D submicron lithography," J. Micromech. Microeng., 17 (May 2007) R81-R95. (Year: 2007).*
(Continued)

*Primary Examiner* — Anita K Alanko
(74) *Attorney, Agent, or Firm* — Brinks Gilson & Lione

(57) ABSTRACT

A method for microassembly of heterogeneous materials comprises contacting a stamp with an ink disposed on a donor substrate to form an inked stamp, where the ink is reversibly bound to the stamp. The inked stamp is stamped onto a receiving substrate or onto an object on the receiving substrate, and the stamp is removed, thereby transferring the ink to the receiving substrate. The ink and the receiving substrate or the ink and the object are thermally joined, thereby forming a microassembly of heterogeneous materials. The ink may comprise a first material and the receiving substrate or the object may comprise a second material different from the first material.

17 Claims, 26 Drawing Sheets

(51) Int. Cl.

| | |
|---|---|
| H01L 21/311 | (2006.01) |
| H01L 21/3065 | (2006.01) |
| B41K 3/24 | (2006.01) |
| B41K 3/56 | (2006.01) |
| B41K 3/04 | (2006.01) |
| C09D 11/103 | (2014.01) |
| B41K 3/62 | (2006.01) |

(56) References Cited

U.S. PATENT DOCUMENTS

| | | |
|---|---|---|
| 8,093,340 B2 | 1/2012 | Xie et al. |
| 8,236,129 B2 | 8/2012 | Xie et al. |
| 8,237,324 B2 | 8/2012 | Pei et al. |
| 8,251,163 B2 | 8/2012 | Xie et al. |
| 8,628,838 B2 | 1/2014 | Xie et al. |
| 8,685,528 B2 | 4/2014 | Xie et al. |
| 2010/0123268 A1 | 5/2010 | Menard |
| 2013/0069275 A1 | 3/2013 | Menard et al. |
| 2014/0069578 A1 | 3/2014 | Xie et al. |
| 2015/0352586 A1 | 12/2015 | Kim et al. |
| 2015/0359043 A1 | 12/2015 | Kim et al. |

OTHER PUBLICATIONS

Allen, M. G. & Senturia, S. D., "Analysis of Critical Debonding Pressures of Stressed Thin Films in the Blister Test," *J. Adhesion*, 25, 303-315 (1988).
Anetsberger, G. et al., "Measuring Nanomechanical Motion With an Imprecision Below the Standard Quantum Limit," *Phys. Rev. A*, 82, 061804 (2010).
Armani, D. K., Kippenberg, T. J., Spillane, S. M. & Vahala, K. J., "Ultra-High-Q Toroid Microcavity on a Chip," *Nature*, 421, 925-928 (2003).
Ayón, A. A. et al., "Characterization of Silicon Wafer Bonding for Power MEMS Applications," *Sensors and Actuatuators A*, 103, 1-8 (2003).
Berger, M., "Microfabrication Inspired by Lego," *NanoWerk* (2013) pp. 1-3.
Bhaswara, A. et al., "Fabrication of Nanoplate Resonating Structures via Micro-Masonry," *J. Micromech. Microeng*, 24, 115012 (2014).
Bhaswara, A. et al., "A Simple Fabrication Process Based on Micro-Masonry for the Realization of Nanoplate Resonators with Integrated Actuation and Detection Schemes," *Frontiers in Mechanical Engineering*, vol. 2, Article 1, 1-7 (Mar. 2016).
Carlson, Andrew et al., "Active, Programmable Elastomeric Surfaces with Tunable Adhesion for Deterministic Assembly by Transfer Printing," *Advanced Functional Materials*, 22 (2012), pp. 4476-4484.
Dechev, Nikolai et al., "Microassembly of 3-D Microstructures Using a Compliant, Passive Microgripper," *Journal of Microelectromechanical Systems*, 13, 2 (Apr. 2004), pp. 176-189.
Doll, A., Rabold, M., Goldschmidtboing, F. & Woias, P., "Versatile Low Temperature Wafer Bonding and Bond Strength Measurement by a Blister Test Method," *Microsyst. Technol.*, 12, 418-429 (2006).
Eisenhaure, J., "Microstructured Shape Memory Polymer Surfaces with Reversible Dry Adhesion," *ACS Appl. Mater. Interfaces*, 5 (2013) pp. 7714-7717.
Eisenhaure, J. et al., "Microstructured Shape Memory Polymer Surfaces with Reversible Adhesion," *Presentation from International Mechanical Engineering Conference & Exposition* (IMECE) in Houston, TX, Nov. 13, 2012, pp. 1-15.
Eisenhaure, J. et al., "Microstructured Shape Memory Polymer Surfaces with Reversible Dry Adhesion," *Presentation from Materials Research Society (MRS) Fall Meeting in Boston, MA*, Nov. 28, 2012, pp. 1-11.
Eisenhaure, J. et al., "Aphid Foot Inspired Reversible Dry Adhesives," *Abstract from 2012 MRS Fall Meeting in Boston, MA*, Nov. 28, 2012, 1 page.
Eisenhaure, J. et al., "Micro-Structured Shape Memory Polymer Based Stamps with Controllable Adhesion," *Abstract from ASME 2012 International Mechanical Engineering Congress & Exposition (IMECE) in Houston, TX*, Nov. 9-15, 2012, 1 page.
Eisenhaure, J. et al., "The Use of Shape Memory Polymers for MEMS Assembly," *Journal of Microelectromechanical Systems*, vol. 25, No. 1, Feb. 2016 pp. 69-77 (9 pages).
Haliyo, D. Sinan et al., "Advanced applications using [mü]MAD, the adhesion based dynamic micro-manipulator," *Proceedings of the 2003 IEEE/ASME International Conference on Advanced Intelligent Mechatronics* (AIM 2003), pp. 880-885.
Harsh, K. F., Su, B., Zhang, W., Bright, V. M. & Lee, Y. C., "The Realization and Design Considerations of a Flip-Chip Integrated MEMS Tunable Capacitor," *Sensors and Actuators*, 80, 108-118 (2000).
Hohyun, Keum et al., "Electrical Contact at the Interface Between Silicon and Transfer-Printed Gold Films by Eutectic Joining, "*ACS Applied Materials & Interfaces*, (2013) 6061-6065.
Hohyun, Keum et al., "Micro-Masonry for 3D Additive Micromanufacturing" *Journal of Visualized Experiments*, 90, 1-7 (Aug. 2014).
Jeong, J.-W. et al., "Two-Axis MEMS Scanner With Transfer-Printed High-Reflectivity, Broadband Monolithic Silicon Photonic Crystal Mirrors," *Opt. Express*, 21, 13800-13809 (2013).
Judy, J., "Microelectromechanical Systems (MEMS): Fabrication, Design and Applications," *Smart Mater. Struct.*, 10, 1115-1134 (2001).
Keum, Hohyun et al., "Silicon Micro-Masonry Using Elastomeric Stamps for Three-Dimensional Microfabrication," *Journal of Micromechanics and Microengineering*, 22 (2012) 055018 (7 pp).
Keum, H., Chung, H.-J. & Kim, S., "Electrical Contact at the Interface Between Silicon and Transfer-Printed Gold Films by Eutectic Joining," *ACS Appl. Mater. Interfaces* 5(13), 6016-6065 (2013).
Kim, S. et al., "Microstructured Elastomeric Surfaces with Reversible Adhesion and Examples of Their Use in Deterministic Assembly by Transfer Printing," *PNAS*, 107, 40 (2010) pp. 17095-17100.
Kim, S. et al., "Reversible Dry Micro-Fibrillar Adhesives with Thermally Controllable Adhesion," *Soft Matter*, 5 (2009) pp. 3689-3693.
Kim, Seok et al., "Enhanced adhesion with pedestal-shaped elastomeric stamps for transfer printing," *Applied Physics Letters*, 100 (2012), pp. 171909-1-171909-4 (4 pages).
Kippenberg, T. J. & Vahala, K. J., "Cavity Optomechanics: Back-Action at the Mesoscale," *Science*, 321, 1172-1176 (2008).
Knight, J. C., Cheung, G., Jacques, F. & Birks, T. A., "Phase-Matched Excitation of Whispering-Gallery-Mode Resonances by a Fiber Taper," *Opt. Lett.*, 22, 1129-1131 (1997).
Lin, L., "MEMS Post-Packaging by Localized Heating and Bonding," *IEEE Trans. Adv. Packag.*, 23, 608-616 (2000).
Lu, Y., Huang, J. Y., Wang, C., Sun, S. & Lou, J., "Cold Welding of Ultrathin Gold Nanowires," *Nat. Nanotechnol.*, 5, 218-224 (2010).
Mastrangeli, Massimo, "The Fluid Joint: The Soft Spot of Micro- and Nanosystems," *Adv. Mater.*, 27, 4254-4272 (2015).
Maszara, W. P., "Silicon-On-Insulator by Wafer Bonding: A Review," *J. Electrochem. Soc.*, 138, 341-347 (1991).
Meitl, Matthew A. et al., "Transfer Printing by Kinetic Control of Adhesion to an Elastomeric Stamp," *Nature Materials*, 5 (Jan. 2006), pp. 33-38.
Mengüç, Yigit et al., "Gecko-Inspired Controllable Adhesive Structures Applied to Micromanipulation," *Advanced Functional Materials*, 22 (2012) pp. 1246-1254.
Milanovic, V., Maharbiz, M. & Pister, K. S. J., "Batch Transfer Integration of RF Microrelays," *IEEE Microw. Guided Wave Lett.*, 10, 313-315 (2000).
Ning, et al., Hailong, "Transfer-Printing of Tunable Porous Silicon Microcavities with Embedded Emitters," *ACS Photonics*, 1, 1144-1150 (2014).
Oh, Dong-Wook, et al., "Interfacial Thermal Conductance of Transfer-Printed Metal Films," *Advanced Materials*, 23, 43, 5028-5033 (2011).

(56) References Cited

OTHER PUBLICATIONS

Sariola, Veikko et al., "Hybrid Microhandling: a Unified View of Robotic Handling and Self-Assembly," *J. Micro-Nano Mechatron.*, 4, 5-16 (2008).

Spillane, S. M., Kippenberg, T. J. & Vahala, K. J., "Ultralow-Threshold Raman Laser Using a Spherical Dielectric Microcavity," *Nature*, 415, 621-623 (2002).

Suni, T., Henttinen, K., Suni, I. & Makinen, J., "Effects of Plasma Activation on Hydrophilic Bonding of Si and $SiO_2$," *J. Electrochem. Soc.*, 149, 6, G348—G351 (2002).

Tas, N., Sonnenberg, T., Jansen, H., Legtenberg, R. & Elwenspoek, M., "Stiction in Surface Micromachining," *J. Micromech. Microeng.*, 6, 385 (1996).

Vollmer, F., Arnold, S. & Keng, D., "Single Virus Detection From the Reactive Shift of a Whispering-Gallery Mode," *Proc. Natl. Acad. Sci. USA*, 105, 52, 20701-20704 (2008).

Wolffenbuttel, R. F., "Low-Temperature Intermediate Au-Si Wafer Bonding; Eutectic or Silicide Bond," *Sensors and Actuators A*, 62, 680-686 (1997).

Xie, Tao et al., "Facile Tailoring of Thermal Transition Temperatures of Epoxy Shape Memory Polymers," *Polymer*, 50 (2009), pp. 1852-1856.

Xie, Tao et al., "Self-Peeling Reversible Dry Adhesive System," *Chem. Mater.*, 20 (2008), pp. 2866-2868.

Yang, Sang Yoon et al., "Elastomer Surfaces with Directionally Dependent Adhesion Strength and Their Use in Transfer Printing with Continuous Roll-to-Roll Applications," *Advanced Materials*, 24 (2012), pp. 2117-2122.

Yang, Yumi et al., "Arrays of Silicon Micro / Nanostructures Formed in Suspended Configurations for Deterministic Assembly Using Flat and Roller-Type Stamps," *Small*, 7, 4 (2011), pp. 484-491.

Zhang, Yong et al., "Autonomous Robotic Pick-and-Place of Microobjects," *IEEE Transactions on Robotics*, 26, 1 (Feb. 2010), pp. 200-207.

Zhang, Yong et al., "Micro-Masonry of MEMS Sensors and Actuators," *Journal of Microelectromechanical Systems*, 23, 2 (Apr. 2014), pp. 308-314.

\* cited by examiner

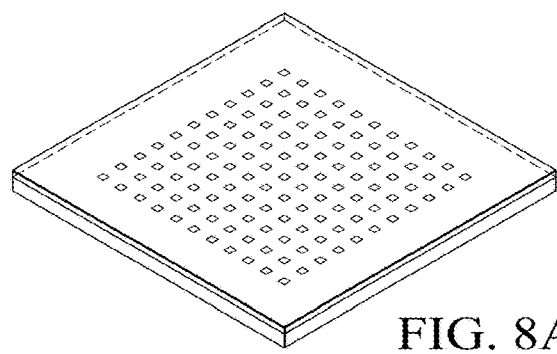
FIG. 8A
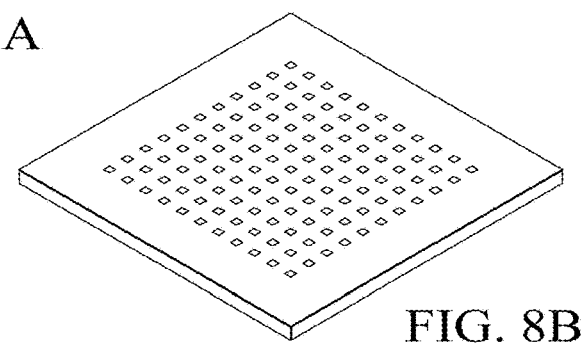
FIG. 8B
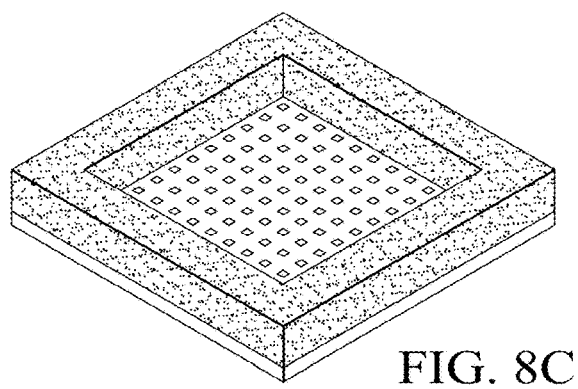
FIG. 8C
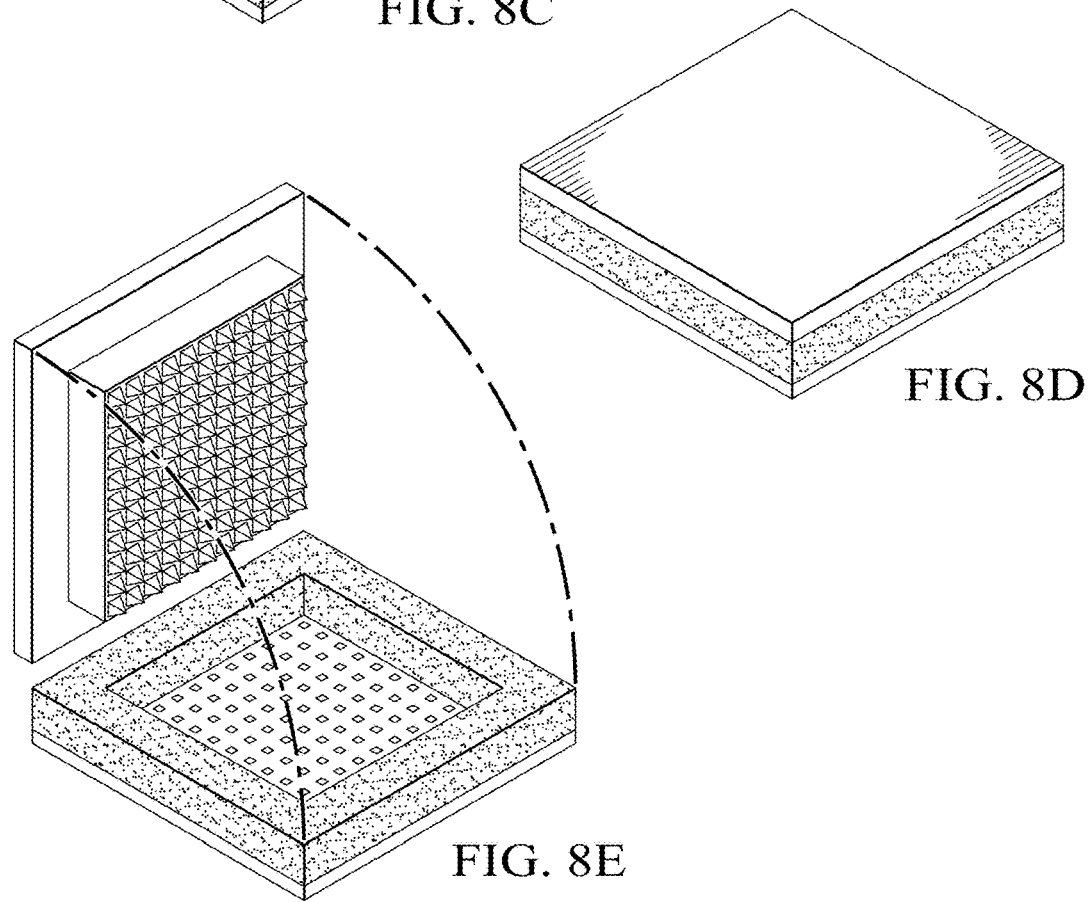
FIG. 8D
FIG. 8E

MICROASSEMBLY OF HETEROGENEOUS MATERIALS

RELATED APPLICATIONS

The present patent document claims the benefit of priority under 35 U.S.C. § 119(e) to U.S. Provisional Patent Application No. 62/528,246, filed Jul. 3, 2017, which is hereby incorporated by reference in its entirety.

FEDERALLY SPONSORED RESEARCH OR DEVELOPMENT

This invention was made with government support under contract number CMMI-1351370 awarded by the National Science Foundation. The government has certain rights in the invention.

TECHNICAL FIELD

The present disclosure is related generally to microfabrication and more particularly to a method of microassembly involving transfer printing and thermal joining.

BACKGROUND

Photolithography has been the dominant manufacturing technique in micro/nano scale manufacturing due to its parallel and batch process nature. The convenience in scalability has significantly reduced the unit cost of individual microelectromechanical systems (MEMS) and integrated chips (IC), enabling broader adaptation of devices ubiquitously found in our everyday lives. While enhanced exposure techniques and the development of various photoresists (PR) have enabled the miniaturization of IC devices down to the nanometer regime, the form factor of such devices is generally limited to two dimensions owing to the planar characteristics of the photolithography process.

Microscale devices with a three-dimensional (3D) form factor have found application in microsystems such as radiofrequency (RF) MEMS switches, mechanical resonators, gyroscopes and pressure sensors, to name a few, due to the inherent advantages of 3D architectures. However, as indicated, fabricating devices with 3D form factors present a challenge for photolithographic patterning methods. For improved performance (e.g., higher sensitivity), such 3D devices may benefit from delicately suspended structures, which are typically achieved by removal of a sacrificial layer buried beneath the structures. Another challenge is integrating heterogeneous materials in MEMS and IC devices using microfabrication given the disparate process parameters of different classes of materials.

Microassembly methods, such as transfer printing, may overcome drawbacks of monolithic microfabrication and permit novel 3D architectures to be fabricated for microsystems. In the early stages of the development of transfer printing, flat surfaced polydimethylsiloxane (PDMS) stamps were utilized to transfer objects onto target receiving sites. Such flat-surfaced PDMS stamps control adhesion by exploiting the viscoelastic nature of the stamp material, yet with bounded reversibility. For this reason, to promote successful transfer printing, highly adhesive receiver substrates were adopted. However, such highly adhesive surfaces are generally polymeric, which limits applications for functional microsystems. The development of various stamps that exhibit a high adhesion on/off ratio has been important to expand the applicability of transfer printing for microsystem fabrication; however, further advancements are needed.

BRIEF SUMMARY

A method for microassembly of heterogeneous materials comprises contacting a stamp with a solid-phase ink disposed on a donor substrate to form an inked stamp, where the solid-phase ink is reversibly bound to the stamp. The inked stamp is stamped onto a receiving substrate or onto an object on the receiving substrate, and the stamp is removed, thereby transferring the solid-phase ink to the receiving substrate. The solid-phase ink is then thermally joined with the object or the receiving substrate to form a microassembly of heterogeneous materials. The object on the substrate may be a previously deposited solid-phase ink. Throughout the disclosure and claims, the terms "solid-phase ink" and "ink" may be used interchangeably.

A method of fabricating a polymeric ink on a donor substrate for transfer printing includes: coating a sacrificial layer onto a silicon substrate; coating a polymeric material on the sacrificial layer and curing to form a polymer layer; patterning the polymer layer to form a polymeric ink pattern; and removing the sacrificial layer, thereby forming the polymeric ink.

A method of fabricating a $SiO_2$ ink on a donor substrate for transfer printing includes: growing a $SiO_2$ layer on a silicon layer; patterning the $SiO_2$ layer to form a $SiO_2$ ink pattern on the silicon layer; patterning the silicon layer to form a silicon pattern laterally surrounding and underlying the $SiO_2$ ink pattern, thereby exposing a buried oxide layer away from the $SiO_2$ ink pattern; covering the $SiO_2$ ink pattern with photoresist and forming one or more photoresist anchors to the buried oxide layer; and removing the silicon pattern, thereby forming the $SiO_2$ ink.

BRIEF DESCRIPTION OF THE DRAWINGS

FIG. 3A shows a Si disc ink, separately prepared on a donor substrate, transferred onto a receiving substrate and joined for hermetic sealing through Si—Si fusion bonding, and FIG.

3B shows a cross-sectional view of the assembled specimen of this example with dimensions.

Figure 3A:
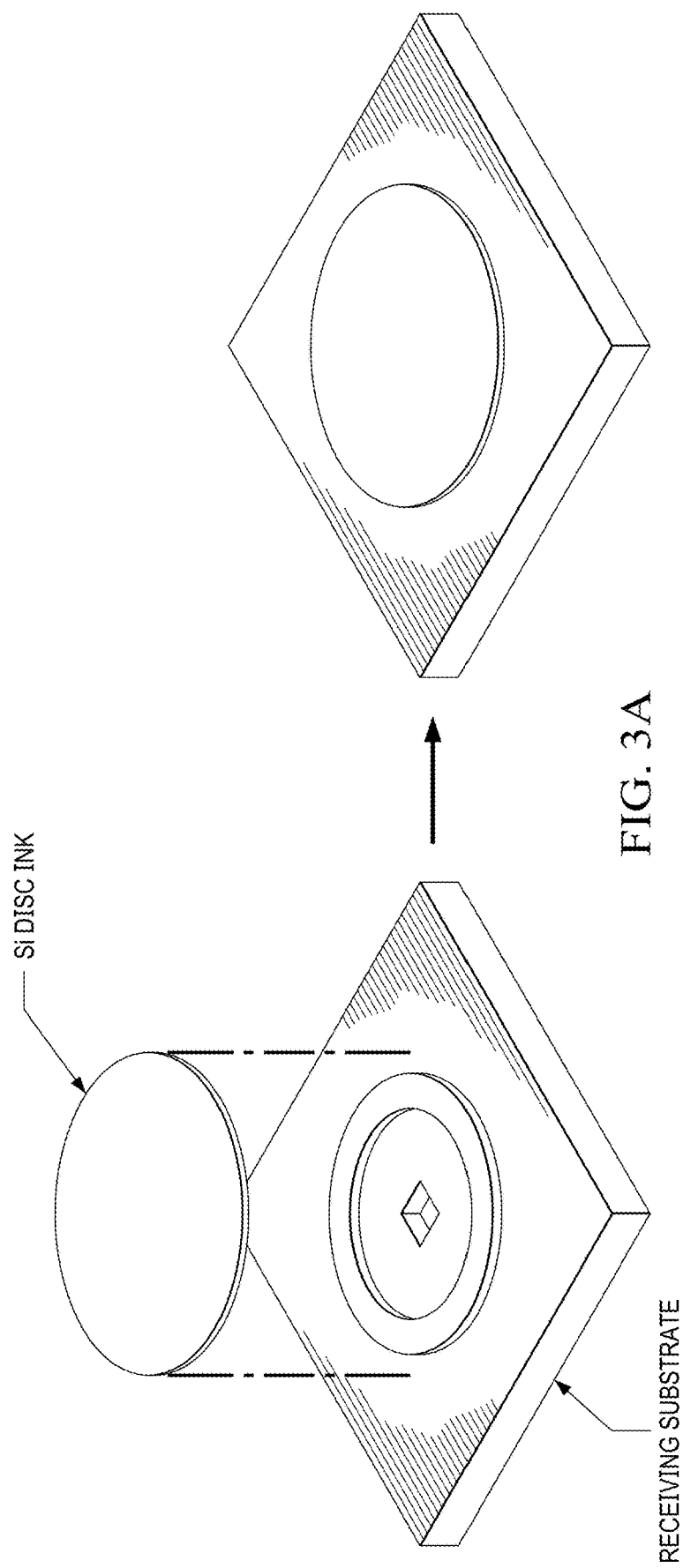
FIGS. 3A and 3B show schematics of a Si—Si blister test specimen assembled via microassembly, where
Figure 3B:
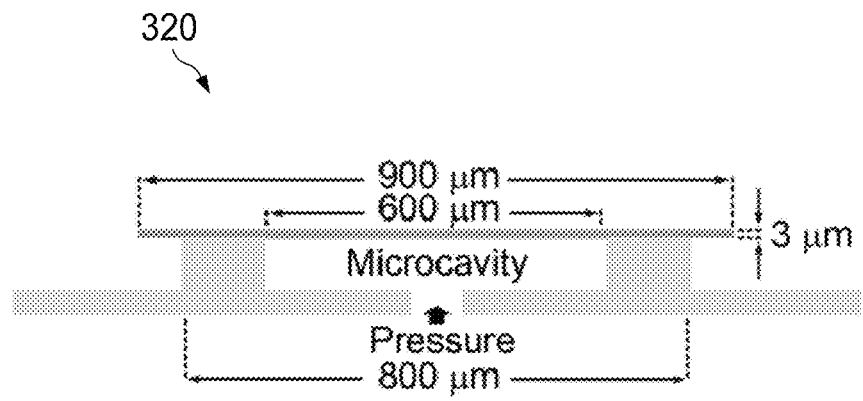
Figure 3C:
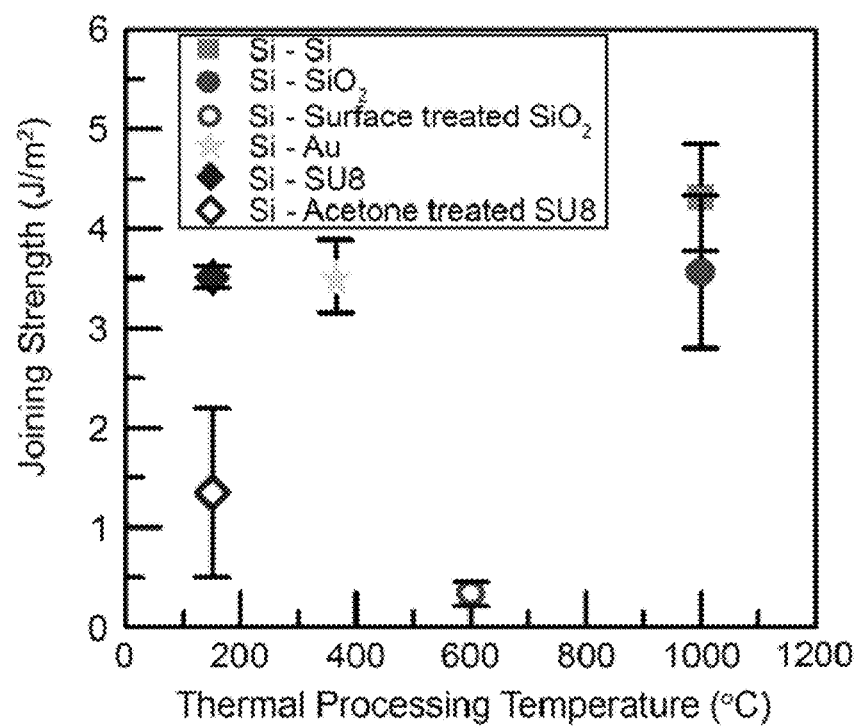

FIG. 3C shows comprehensive data of joining strength with respect to material pairs and thermal processing temperatures obtained through blister tests.

Figure 3D:
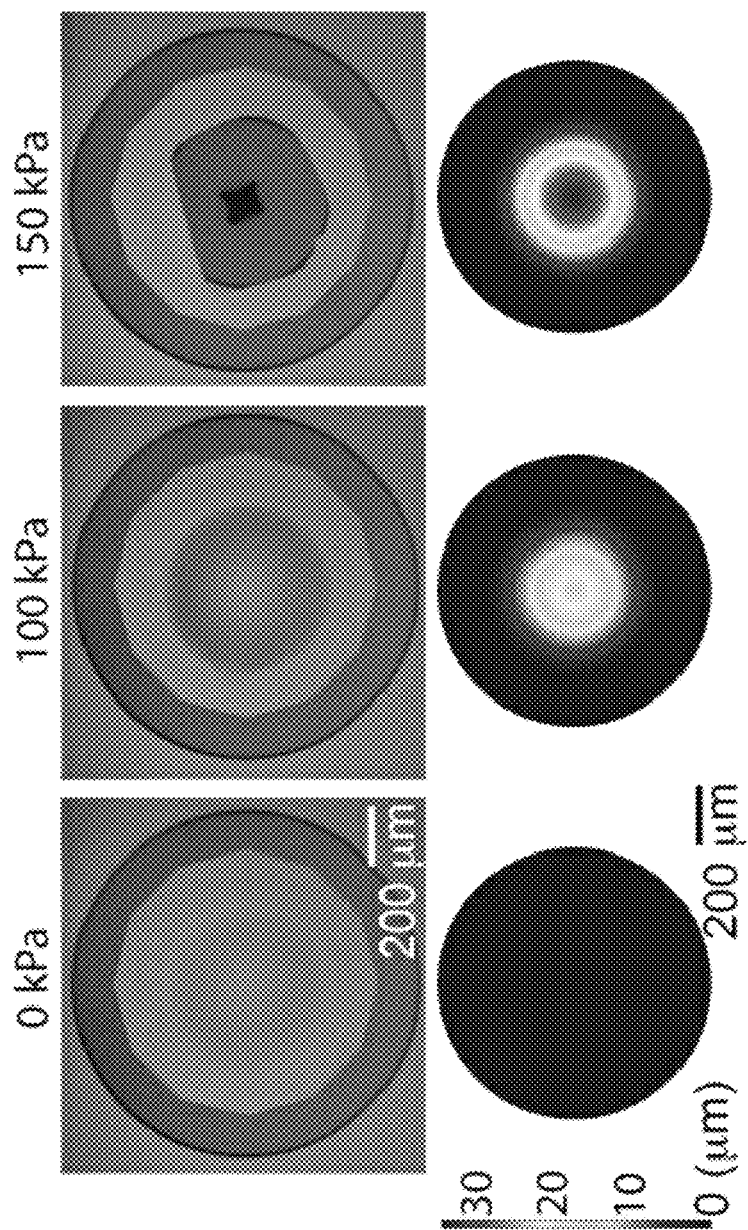

FIG. 3D shows representative optical microscope images and finite element analysis (FEA) results for a Si—Si blister test specimen at three pressure states that describe the central deflection in the micro assembled Si disc.

Figure 4A:
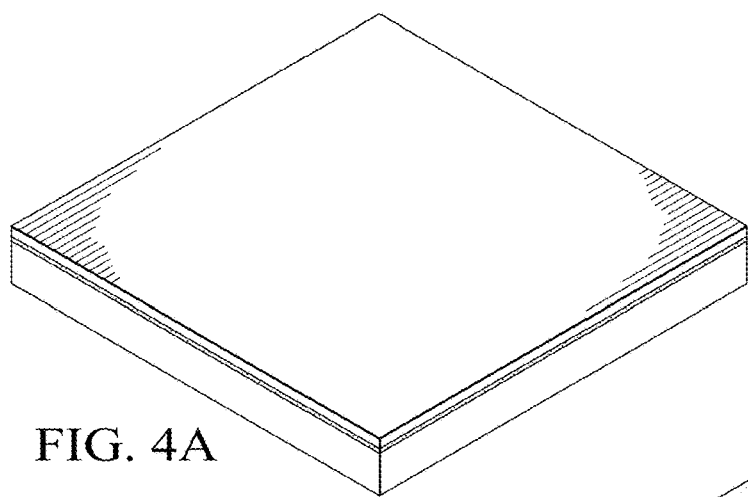
Figure 4B:
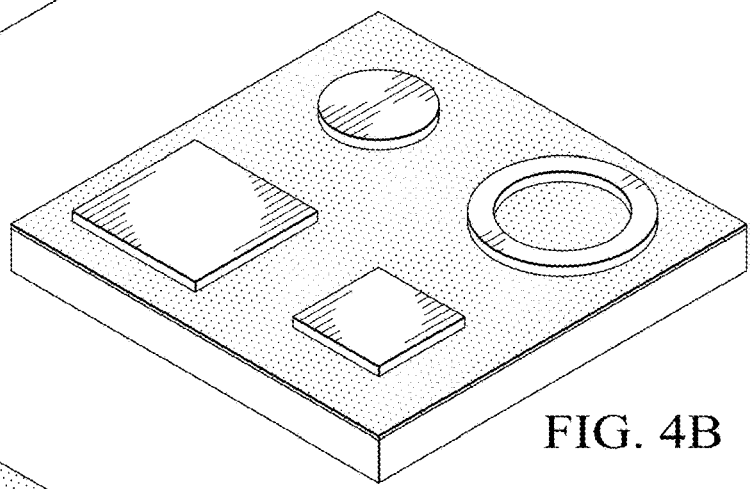
Figure 4C:
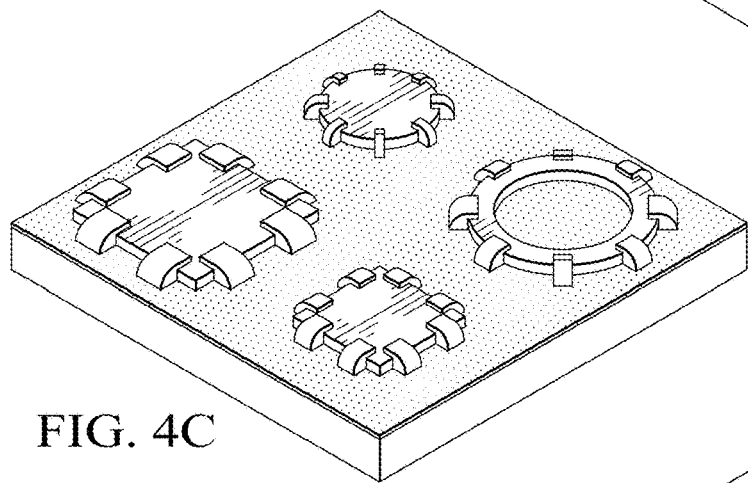
Figure 4D:
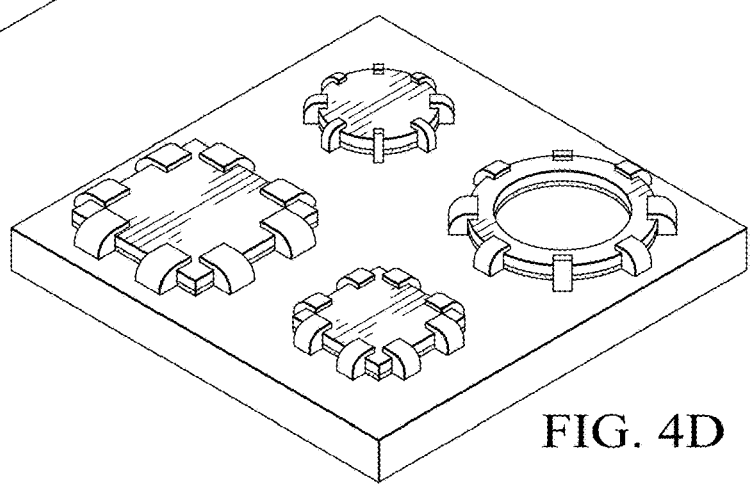
Figure 4E:
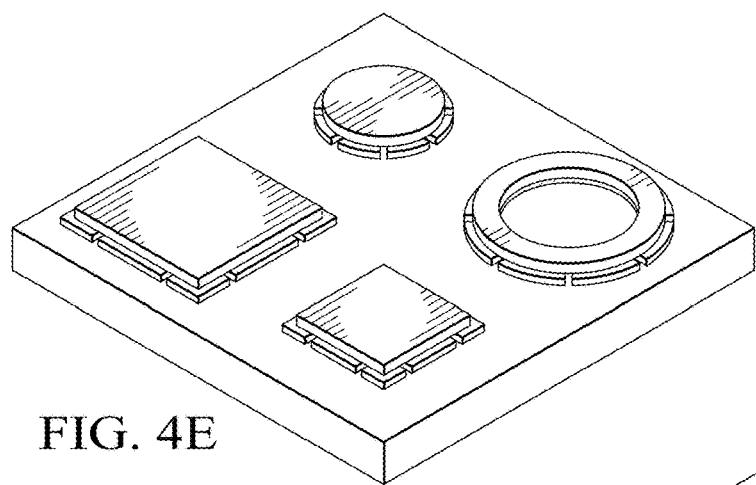
Figure 4F:
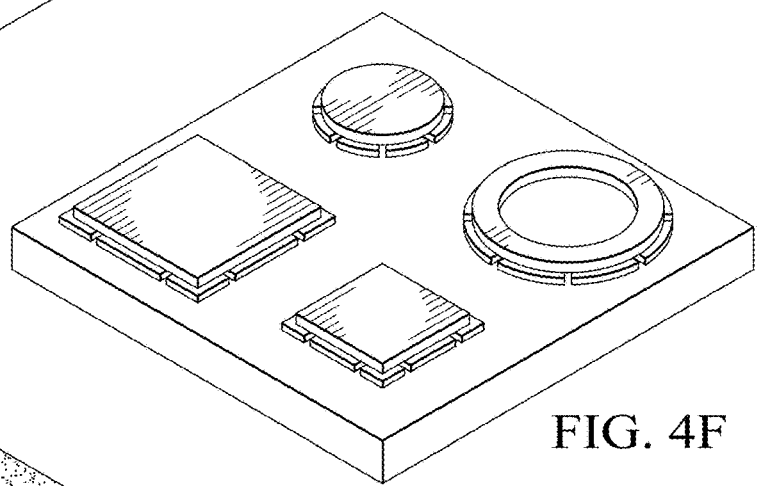

FIGS. 4A-4F show schematics of silicon (Si) ink fabrication, including: a SOI wafer with desired device layer properties and 1 μm thick buried oxide layer, shown in FIG. 4A; a patterned device Si layer, shown in FIG. 4B; photoresist (PR) patterning for selective undercut etching, shown in FIG. 4C; removal of exposed buried oxide layer and undercut of oxide layer beneath the patterned Si layer, shown in FIG. 4D; formation of anchors within the undercut region, shown in FIG. 4E; and complete removal of the buried oxide layer, resulting in the suspended Si layer being tethered by PR anchors, shown in FIG. 4F.

Figure 5A:
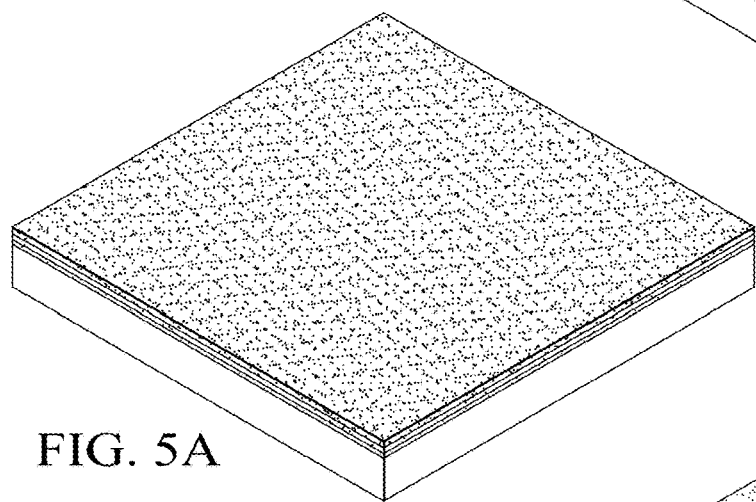
Figure 5B:
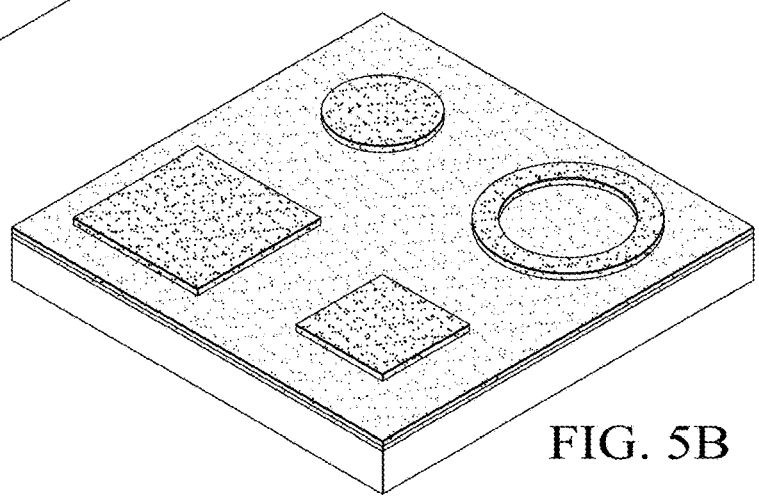

FIGS. 5A-5F show schematics of gold (Au) ink fabrication, including: growth of a ~1 μm thermal oxide on Si wafer followed by titanium (Ti) and Au deposition, shown in FIG. 5A; etch back patterning of Au, shown in FIG. 5B; PR patterning for selective undercut etching, shown in FIG. 5C; removal of exposed Ti and the buried oxide layer and slight undercut of the two layers beneath the patterned Au, shown in FIG. 5D; formation of anchors within the undercut region, shown in FIG. 5E; and complete removal of Ti and the buried oxide layer resulting in the suspended Au layer tethered by PR anchors, shown in FIG. 5F.

Figure 6A:
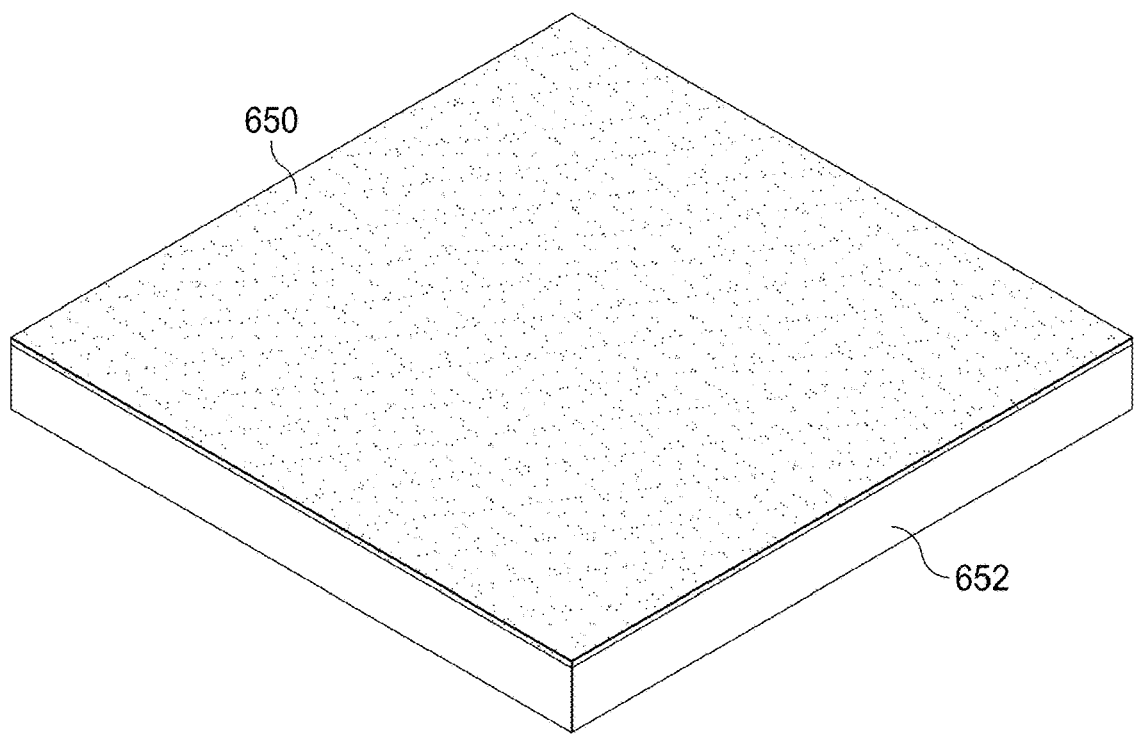
Figure 6B:
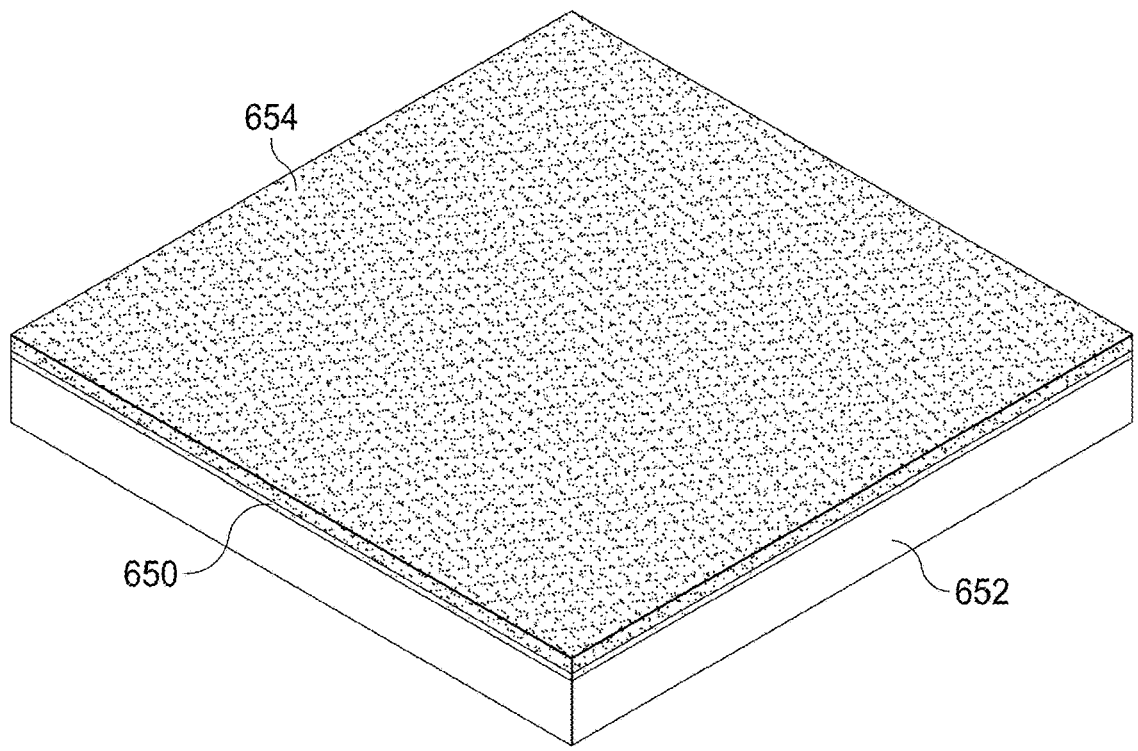
Figure 6C:
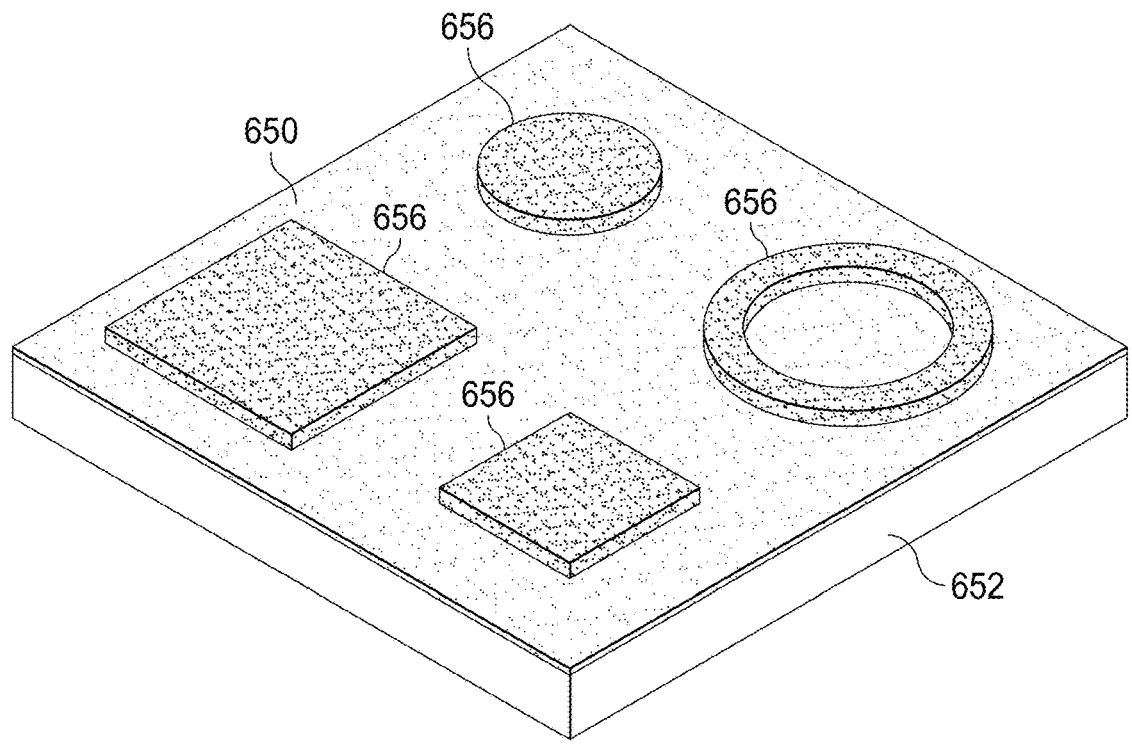
Figure 6D:
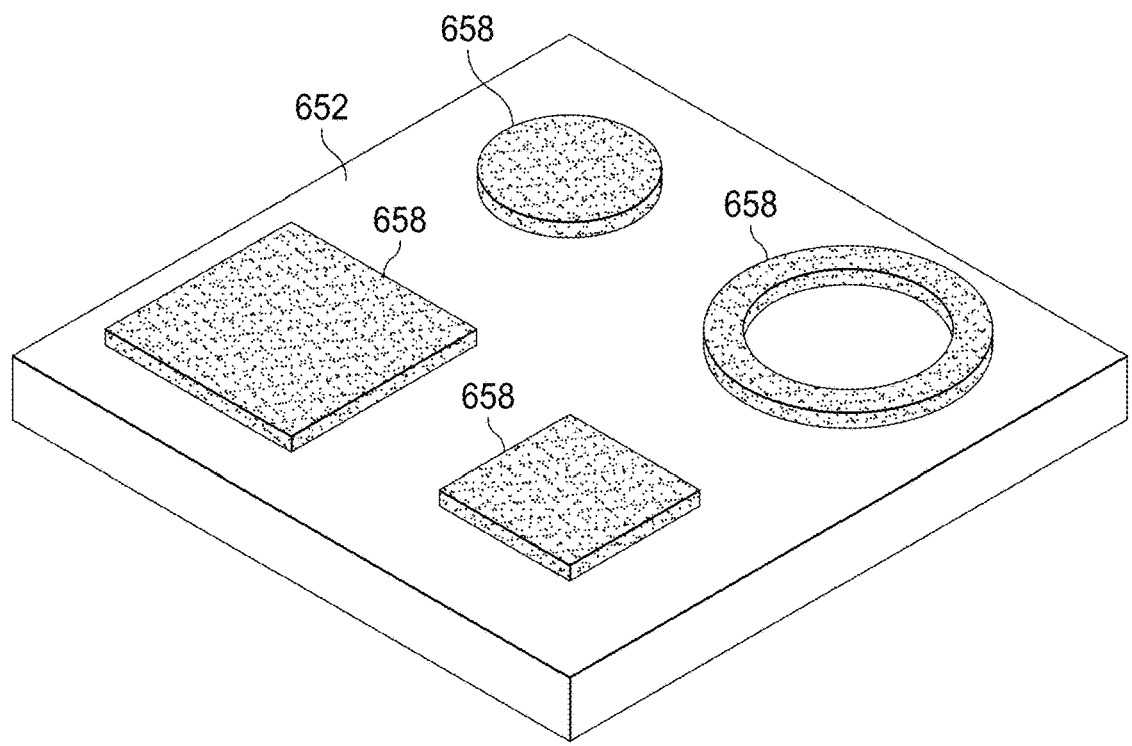

FIGS. 6A-6D show schematics of SU-8 ink fabrication, including: spin coating of PMMA on a Si wafer, shown in FIG. 6A; spin coating of SU-8, shown in FIG. 6B; photolithographic patterning, shown in FIG. 6C; and removal of PMMA layer which reveals SU-8 inks adhered onto the substrate by mere surface adhesion force, shown in FIG. 6D.

Figure 7A:
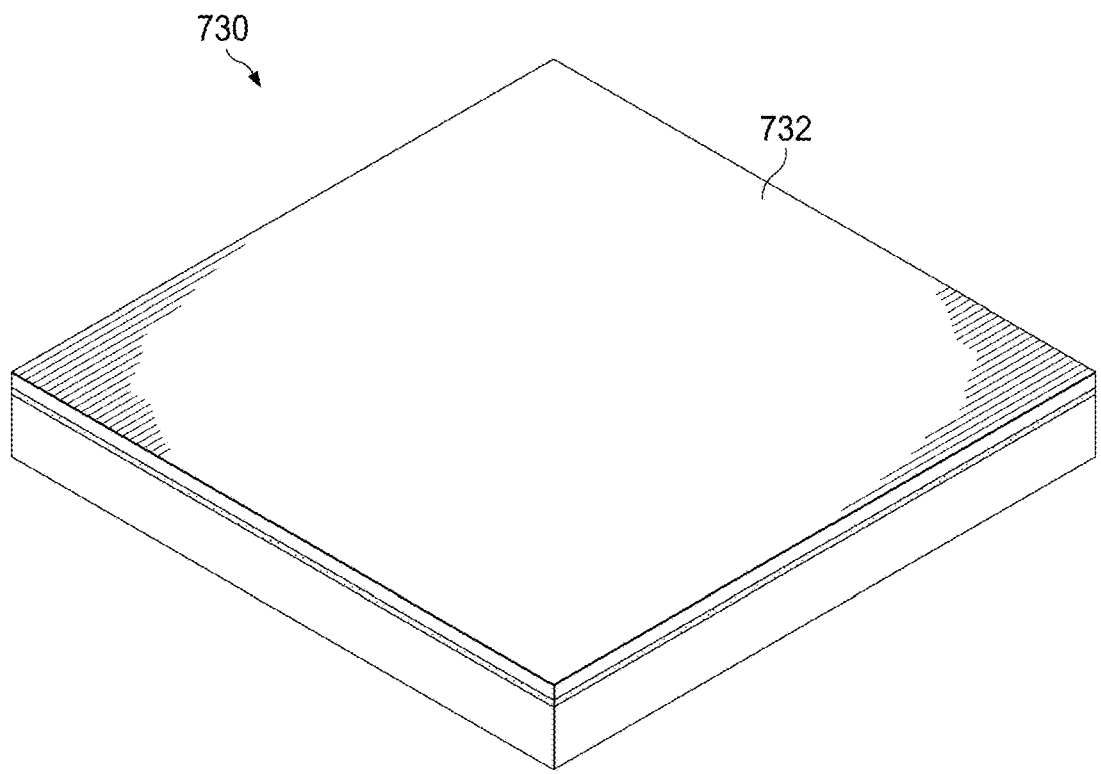
Figure 7B:
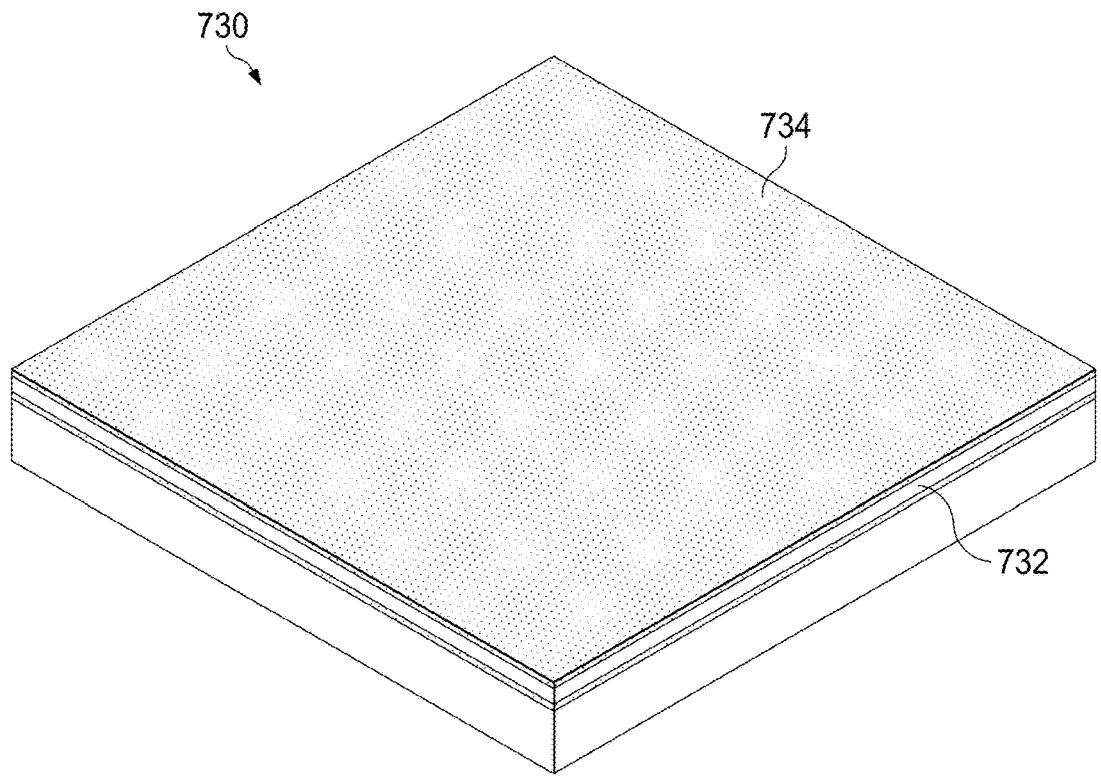
Figure 7C:
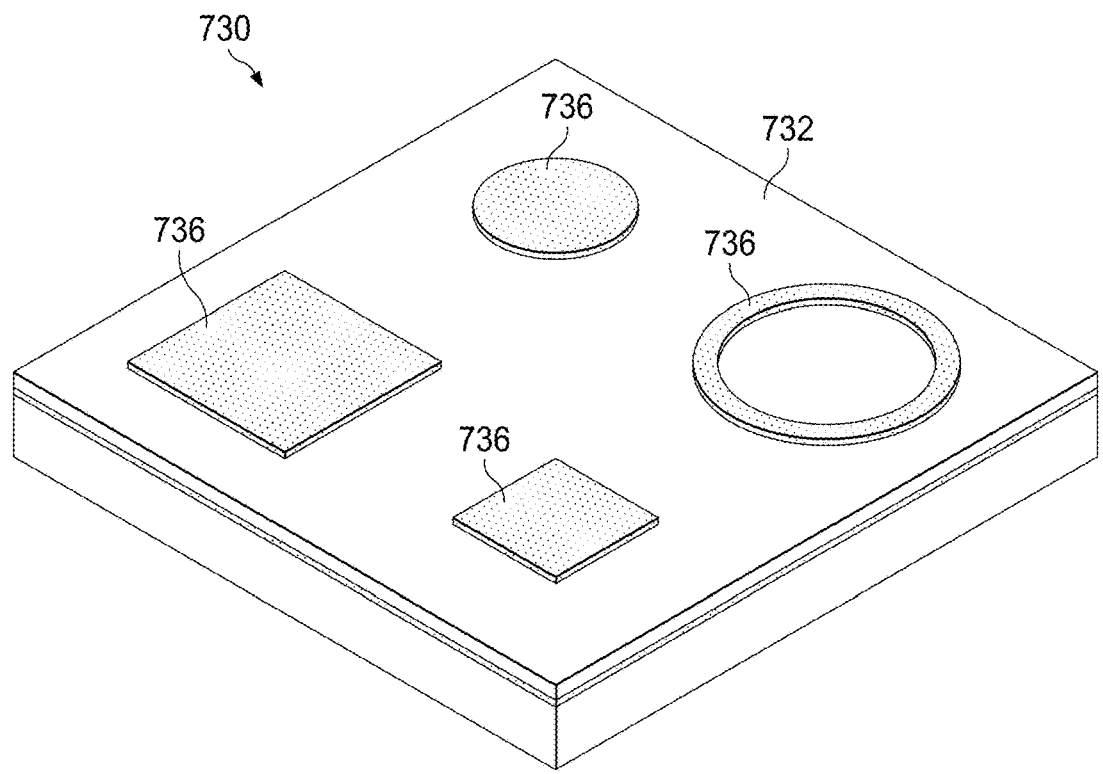
Figure 7D:
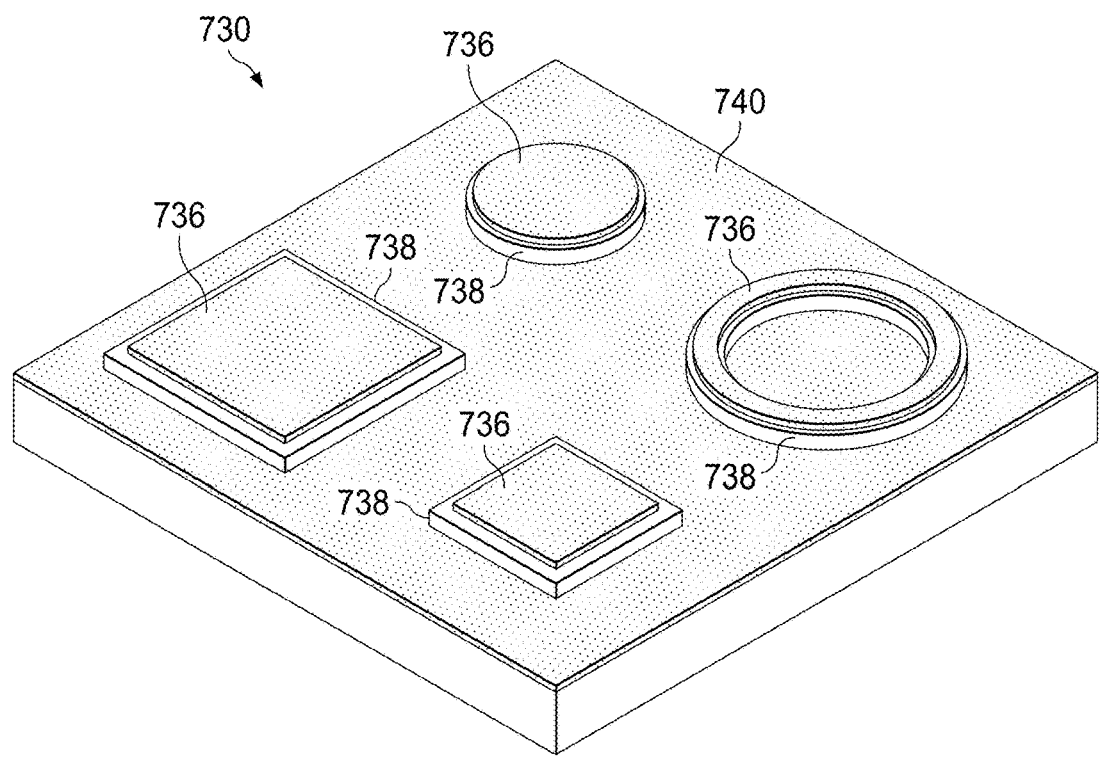

FIGS. 7A-7F show schematics of silicon dioxide ($SiO_2$) ink fabrication, including: providing a SOI wafer, shown in FIG. 7A; thermal oxidation of the device layer, shown in FIG. 7B; patterning of the thermal oxide using hydrofluoric acid (HF), shown in FIG. 7C; removal of the Si layer while ensuring no undercut region beneath the grown $SiO_2$, shown in FIG. 7D; PR patterning to cover the patterned $SiO_2$ inks while anchoring to the buried oxide layer, shown in FIG. 7E; and complete removal of device Si layer using xenon difluoride ($XeF_2$) isotopic etching, shown in FIG. 7F.

FIGS. 8A-8E show schematics of fabrication of a microtip polydimethylsiloxane (PDMS) stamp, including: depositing a silicon nitride layer on a Si wafer and patterning into small squares that serve as bases of the microtip, shown in FIG. 8A; KOH etching of the Si wafer and complete removal of the silicon nitride layer, shown in FIG. 8B; formation of SU8 walls that form a cavity, shown in FIG. 8C; filling the cavity with PDMS and curing, shown in FIG. 8D; and peeling off of the fully cured microtip stamp from the negative mold, shown in FIG. 8E.

Figure 9A:
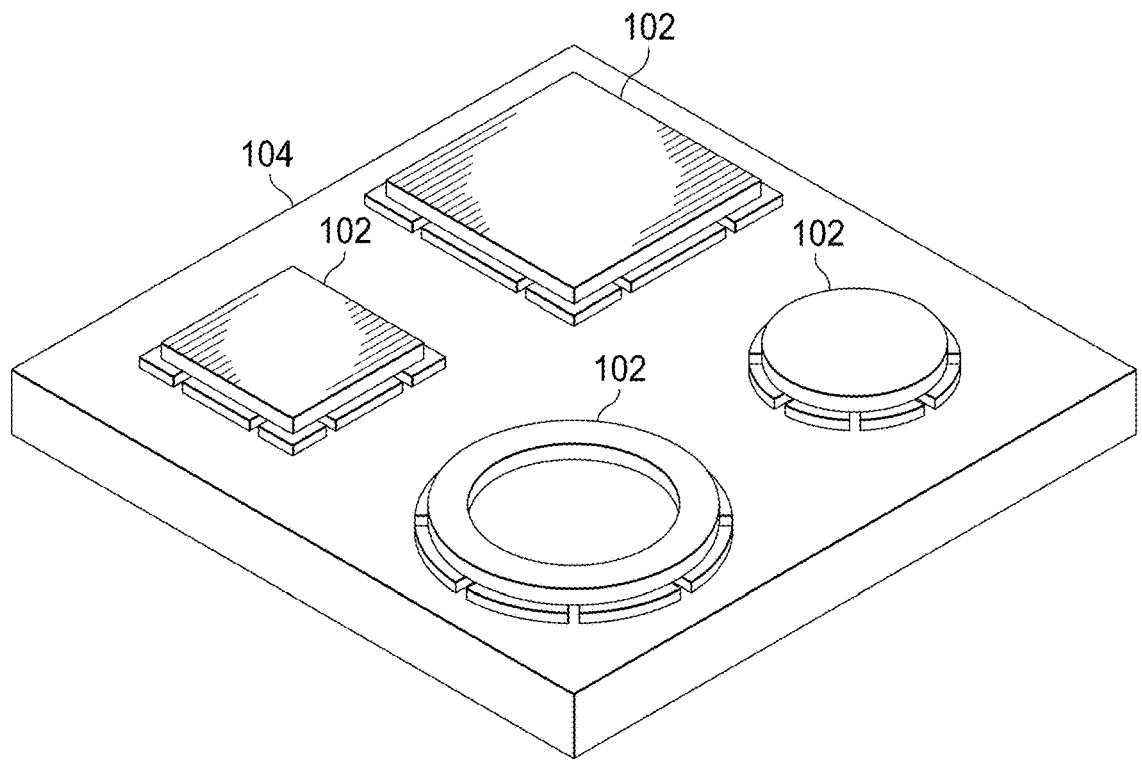
Figure 9B:
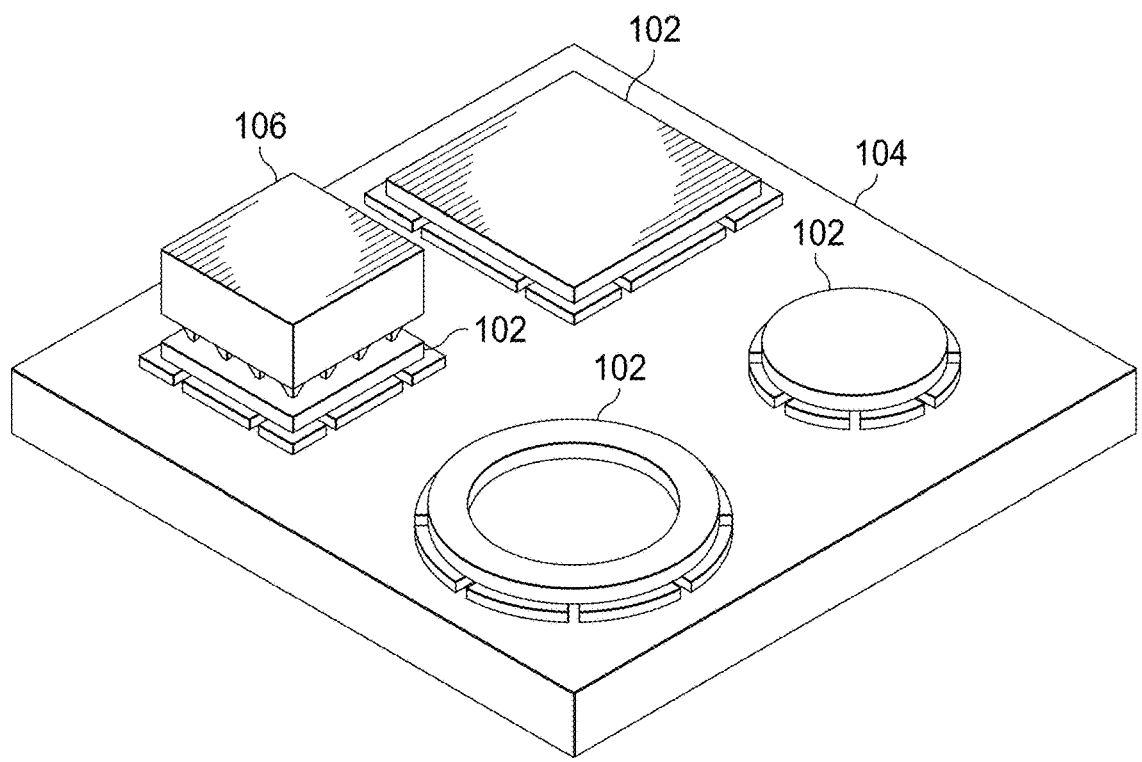
Figure 9C:
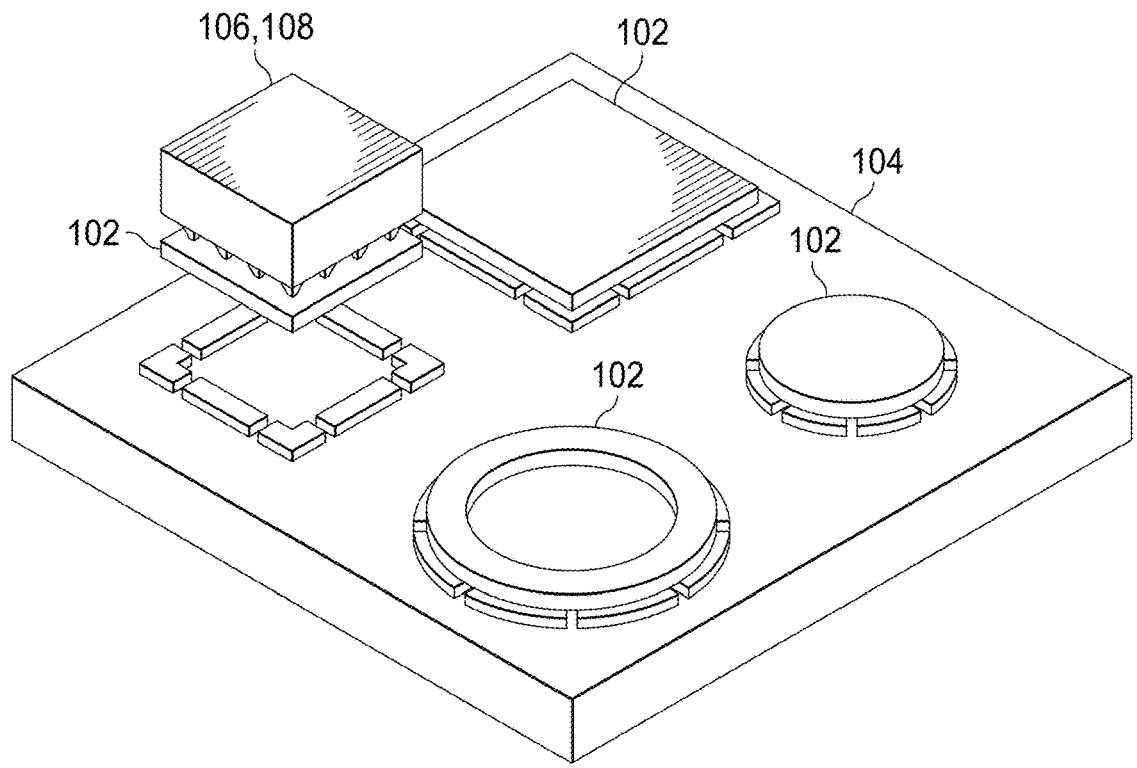
Figure 9D:
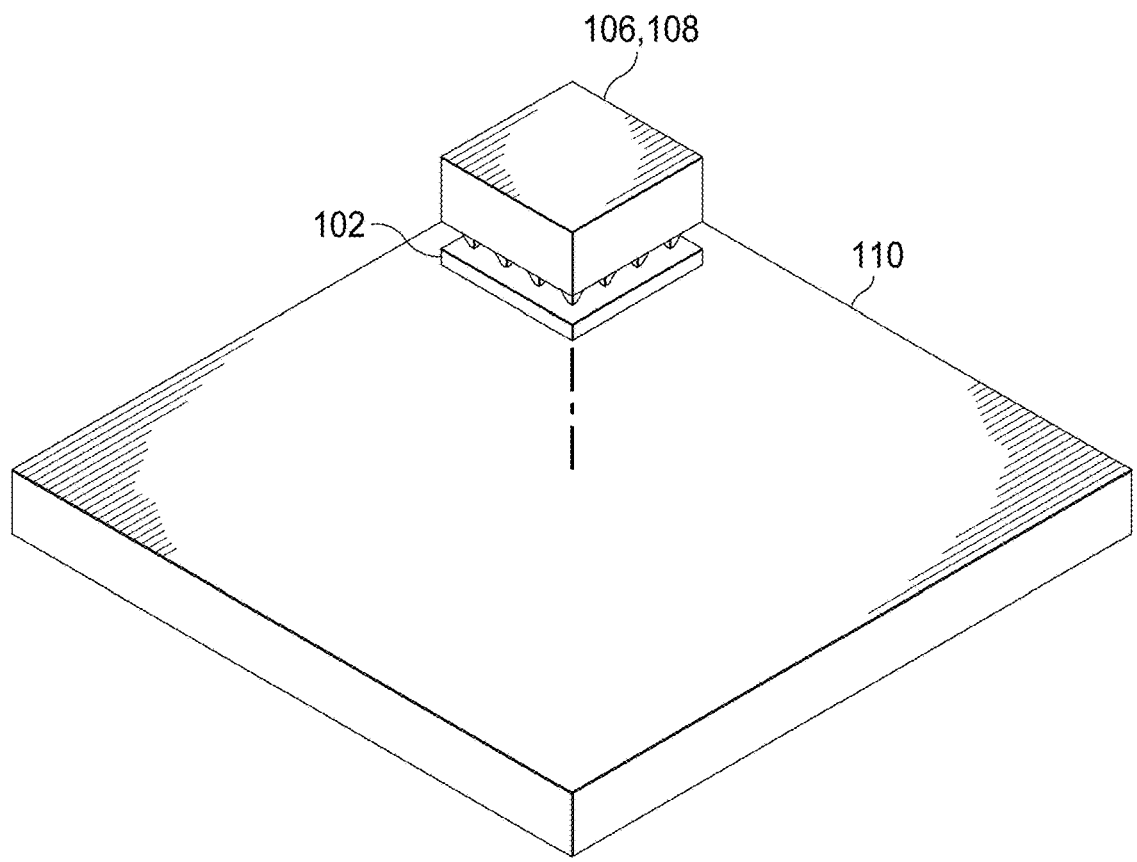
Figure 9E:
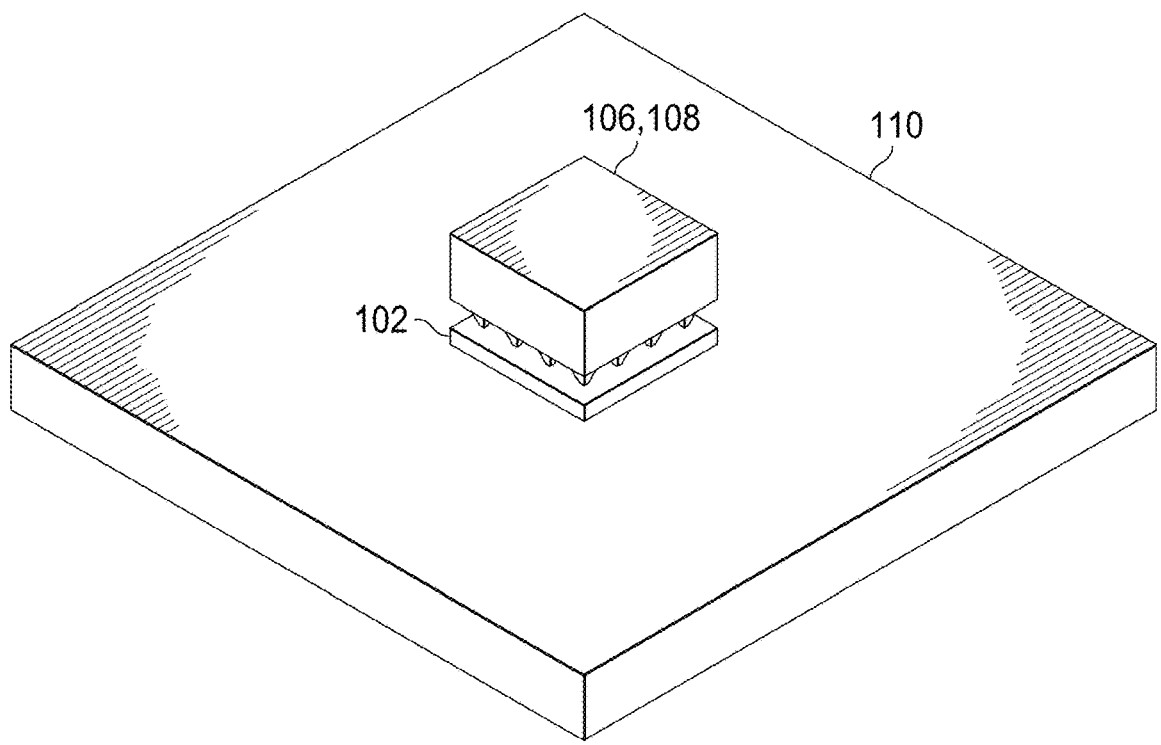
Figure 9F:
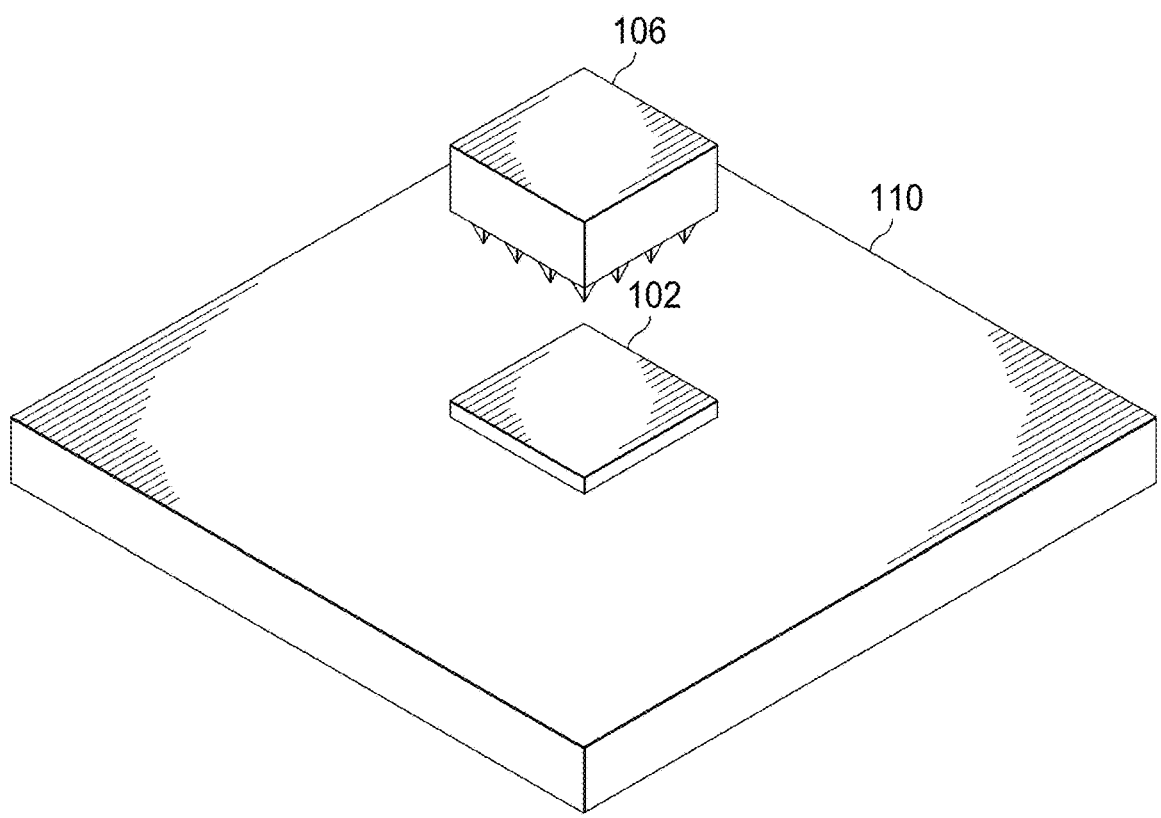

FIGS. 9A-9F show a procedure of transfer printing using an elastomeric microtip stamp, including: fabricating inks on a donor substrate (as described above), shown in FIG. 9A; bringing the elastomeric microtip stamp in contact with an ink with a sufficiently high preload to form fully collapsed microtips, shown in FIG. 9B; rapidly retrieving the stamp such that the ink is adhered to the microtip stamp, and the previously fully collapsed microtips may be fully restored, resulting in minimal contact area at the tips, shown in FIG. 9C; delivering the ink onto a target receiving substrate, shown in FIG. 9D; bringing the ink in contact with the receiving surface, shown in FIG. 9E; and slowly raising the stamp that leaves the ink printed on a receiving substrate, shown in FIG. 9F.

Figure 10A:
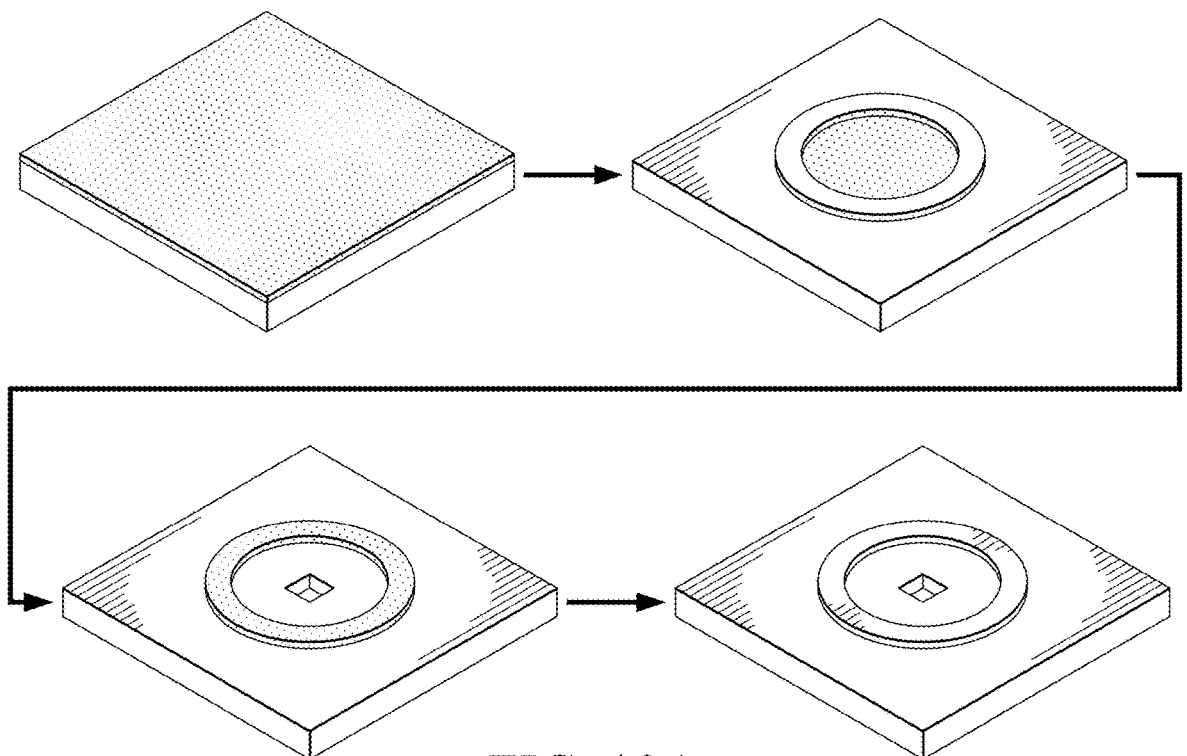
Figure 10B:
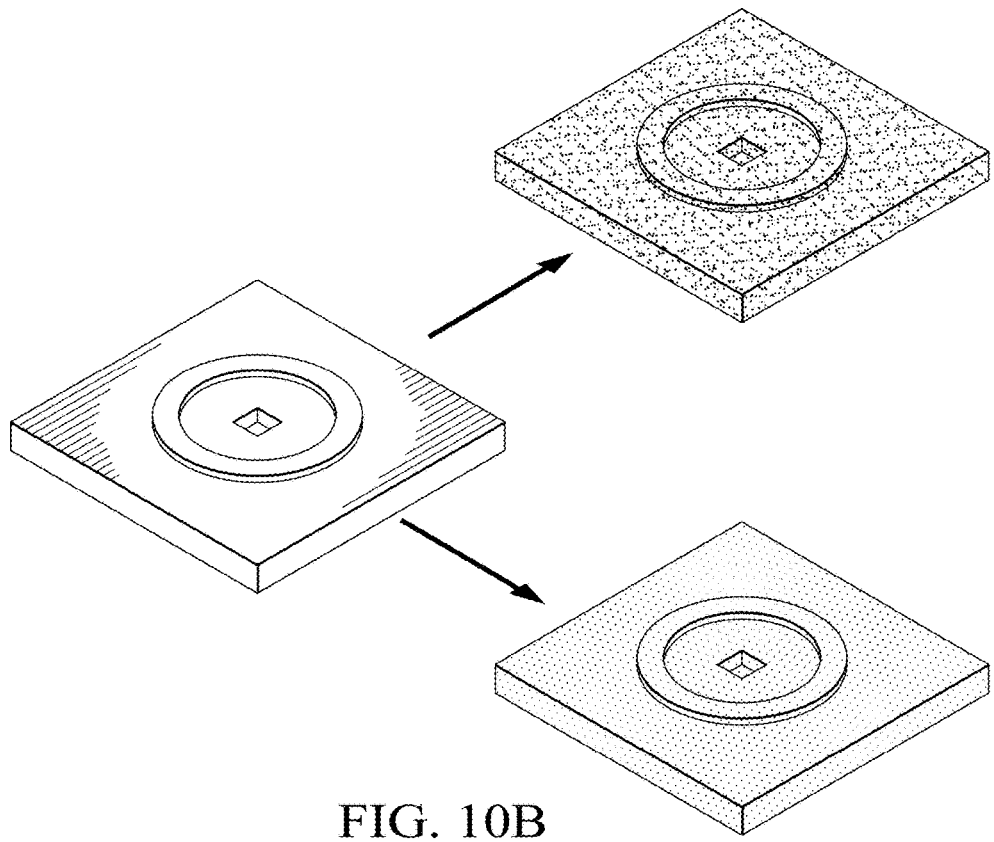
Figure 10C:
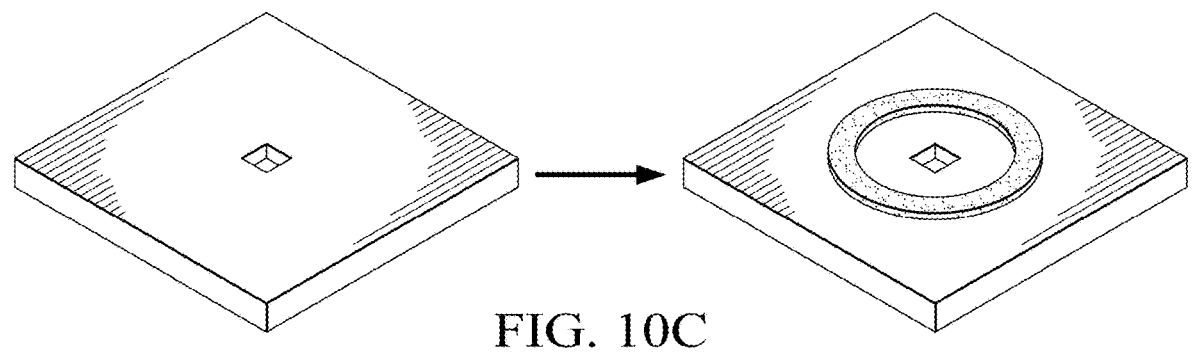

FIGS. 10A-10C show schematics of processing various blister test receiving substrates, including: fabrication flow of an Si receiving substrate for blister test, shown in FIG. 10A, deposition of Cr and Au or growth of $SiO_2$ on the Si receiving substrate to realize an Au or $SiO_2$ coated surface, shown in FIG. 10B; patterning of a SU-8 rim on an Si substrate with an air inlet for SU-8 specimen, shown in FIG. 10C.

Figure 11A:
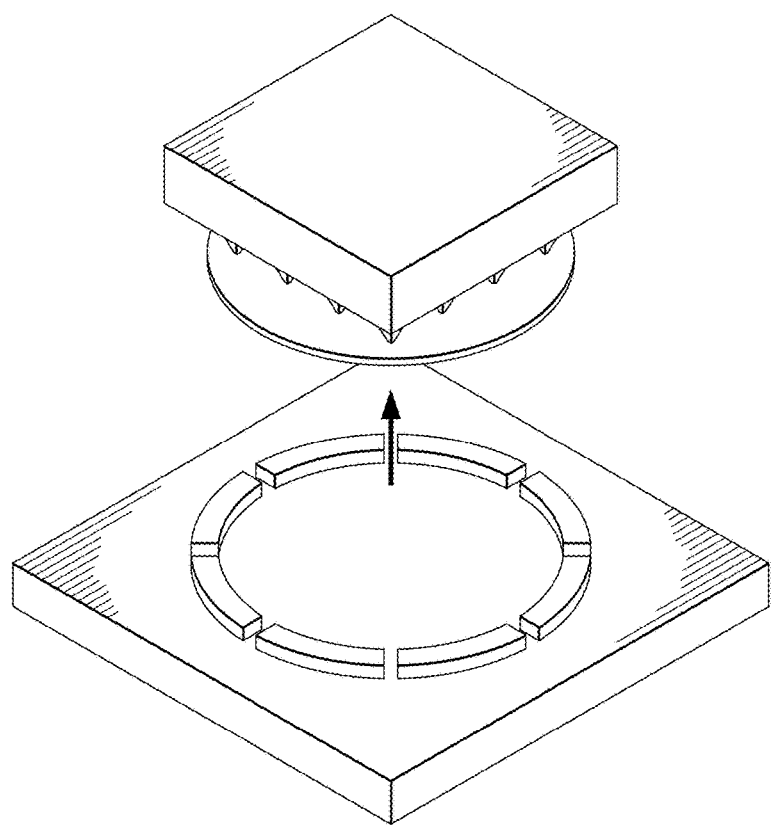
Figure 11B:
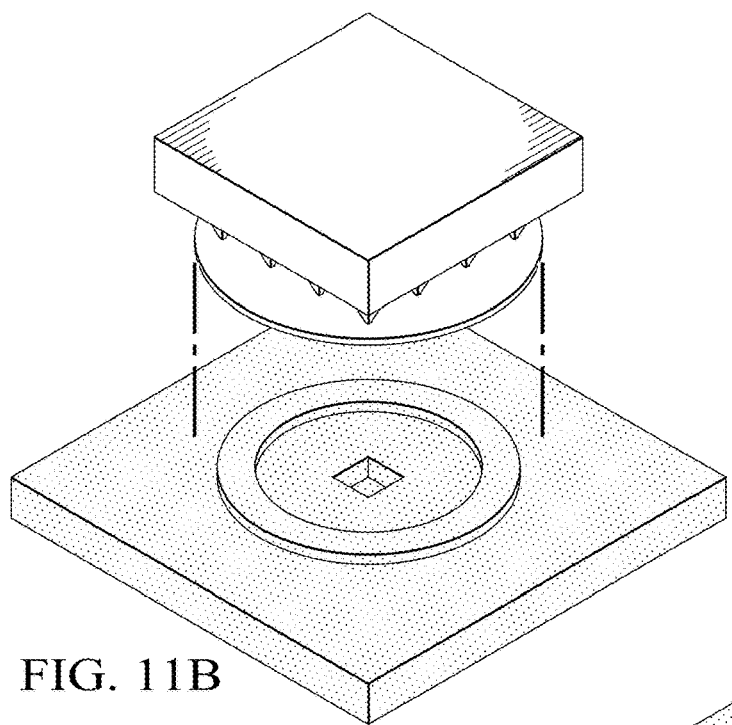
Figure 11C:
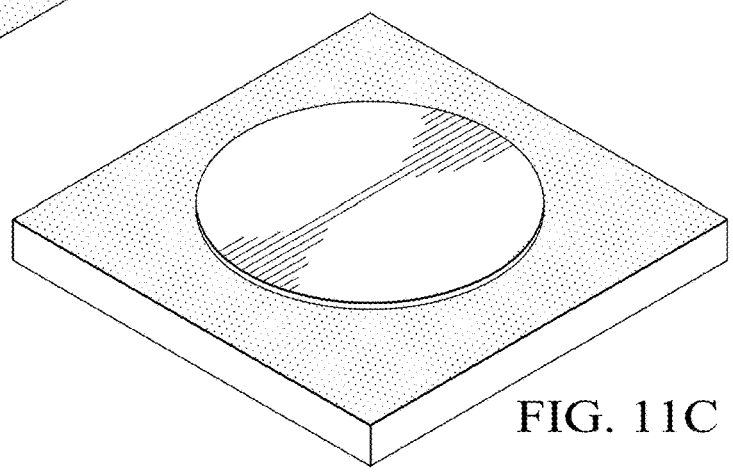
Figure 11D:
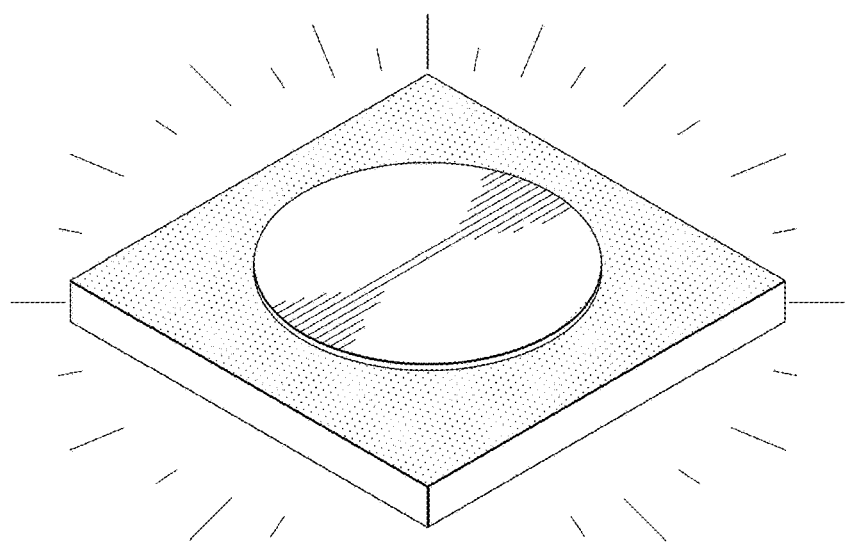

FIGS. 11A-11D show schematics of preparing blister test specimens via microassembly, including picking up a Si disc from a donor substrate prepared as depicted above, as shown in FIG. 11A; transferring the Si disc ink onto a blister test receiving substrate, as shown in FIG. 11B; placing the Si disc ink, as shown in FIG. 11C; and thermally processing the Si disc ink under appropriate conditions to form a robustly joined interface, as shown in FIG. 11D.

Figure 12:
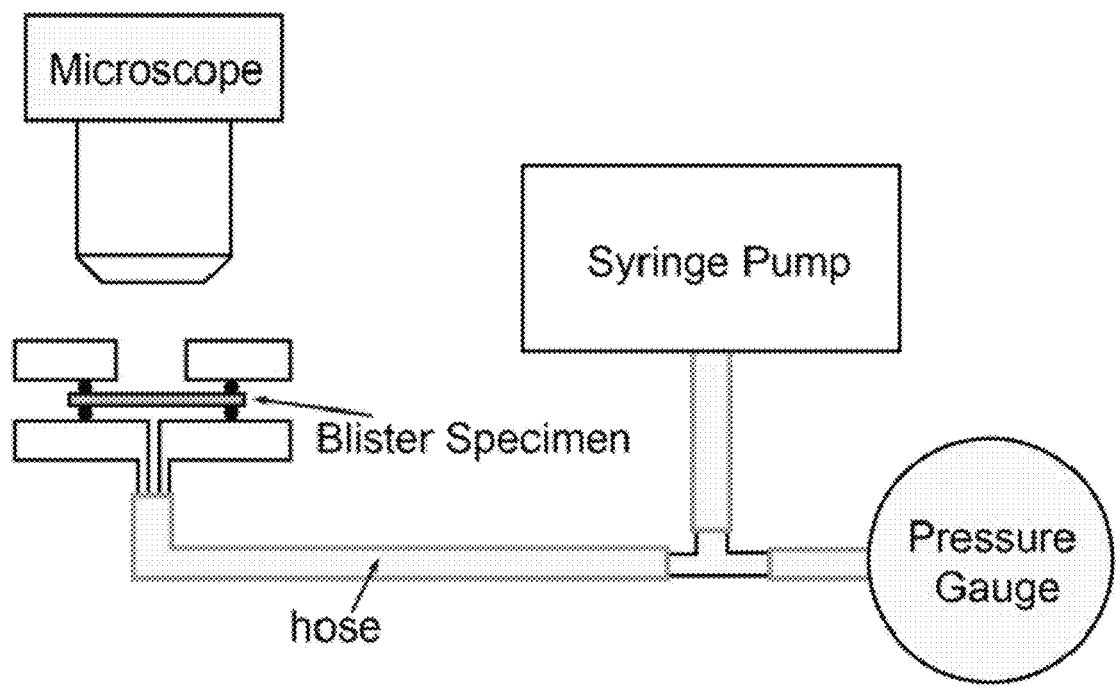

FIG. 12 shows a cross-sectional schematic of an exemplary blister test setup, which may include a polymer jig, hose, pressure gauge, pump (syringe), a custom stage and a microscope.

Figure 13A:
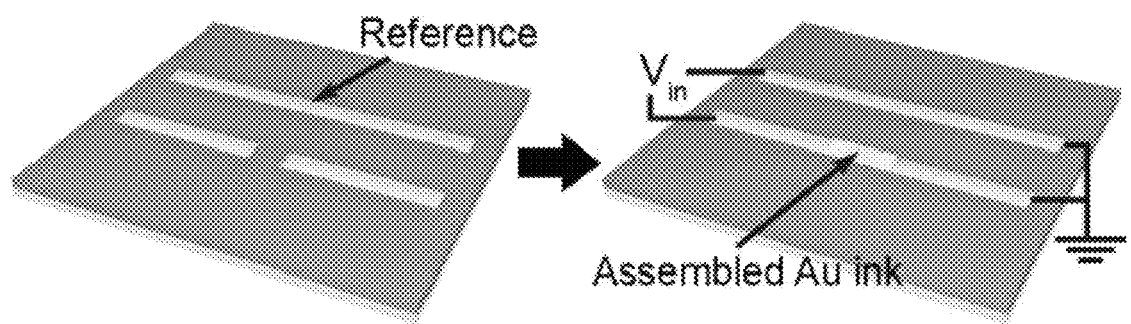
Figure 13B:
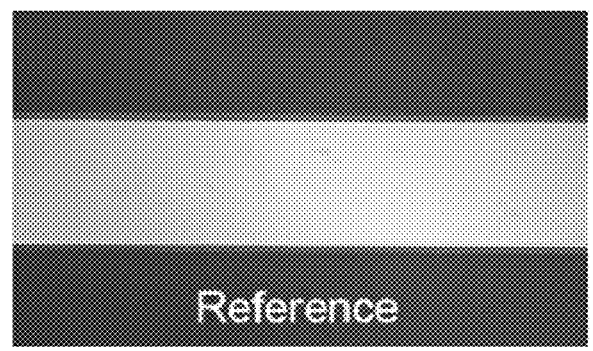
Figure 13C:
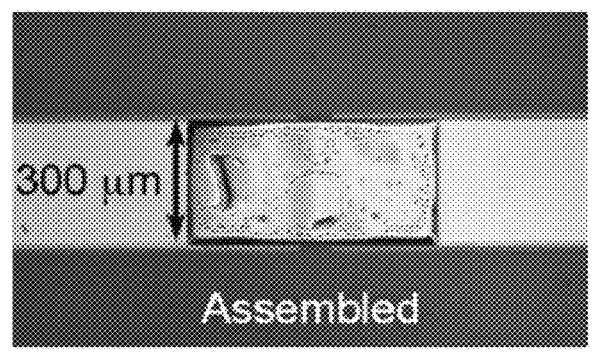
Figure 13D:
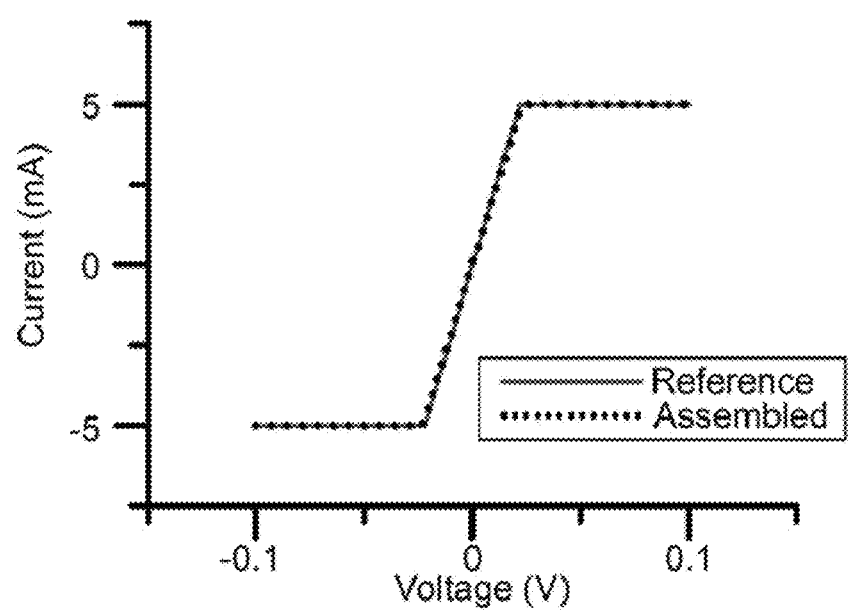

FIGS. 13A-13D show the experimental set-up and results of measurements to determine total resistance of a microassembly comprising Au inks, where a schematic of reference and assembled Au lines is provided in FIG. 13A; optical images of a reference Au line fabricated through photolithography and a connected Au line with an assembled Au ink are shown in FIGS. 13B and 13C; and I-V curves of the reference and assembled Au lines are presented in FIG. 13D.

DETAILED DESCRIPTION

Micro-assembly, which involves sequential transferring and joining of individual micro-scale materials, may overcome shortcomings of monolithic microfabrication and enable novel 3D architectures for microsystems. Transfer printing, inspired from micro contact printing, may utilize the highly reversible surface adhesion of a polymeric manipulator (called a "stamp") to deterministically transfer microscale solid objects (called "solid-phase inks" or "inks") in a dry manner. The ability to transfer inks from a donor substrate where inks are grown and processed to a receiving substrate where inks are thermally bonded reduces the complexity of manufacturing processes required for heterogeneous material integration. Furthermore, the dry nature of transfer printing enhances the process compatibility with other manufacturing techniques.

Microassembly of four different classes of materials semiconductors (e.g., Si), metals (e.g., Au), dielectrics (e.g., $SiO_2$) and polymers (e.g., SU-8) is described in this disclosure. For broader utilization of the microassembly process, $SiO_2$ and SU-8 materials are newly developed as inks. The microassembly method employs reversible adhesion-based transfer printing and thermal processing-based material joining. The interfacial joining characteristics between dissimilar materials are quantitatively studied through blister tests to validate the structural integrity of assembled structures and devices (microassemblies). This work demonstrates the use of microassembly to fabricate 3D heterogeneous microsystems, with relevance not only to MEMS but also to electronics, photonics, metamaterials, and other fields. Furthermore, the microassembly process can complement conventional micromachining techniques by transfer printing and joining an individual constituent of a device at spatially organized sites for enhanced performance or novel functionalities.

Figure 1A:
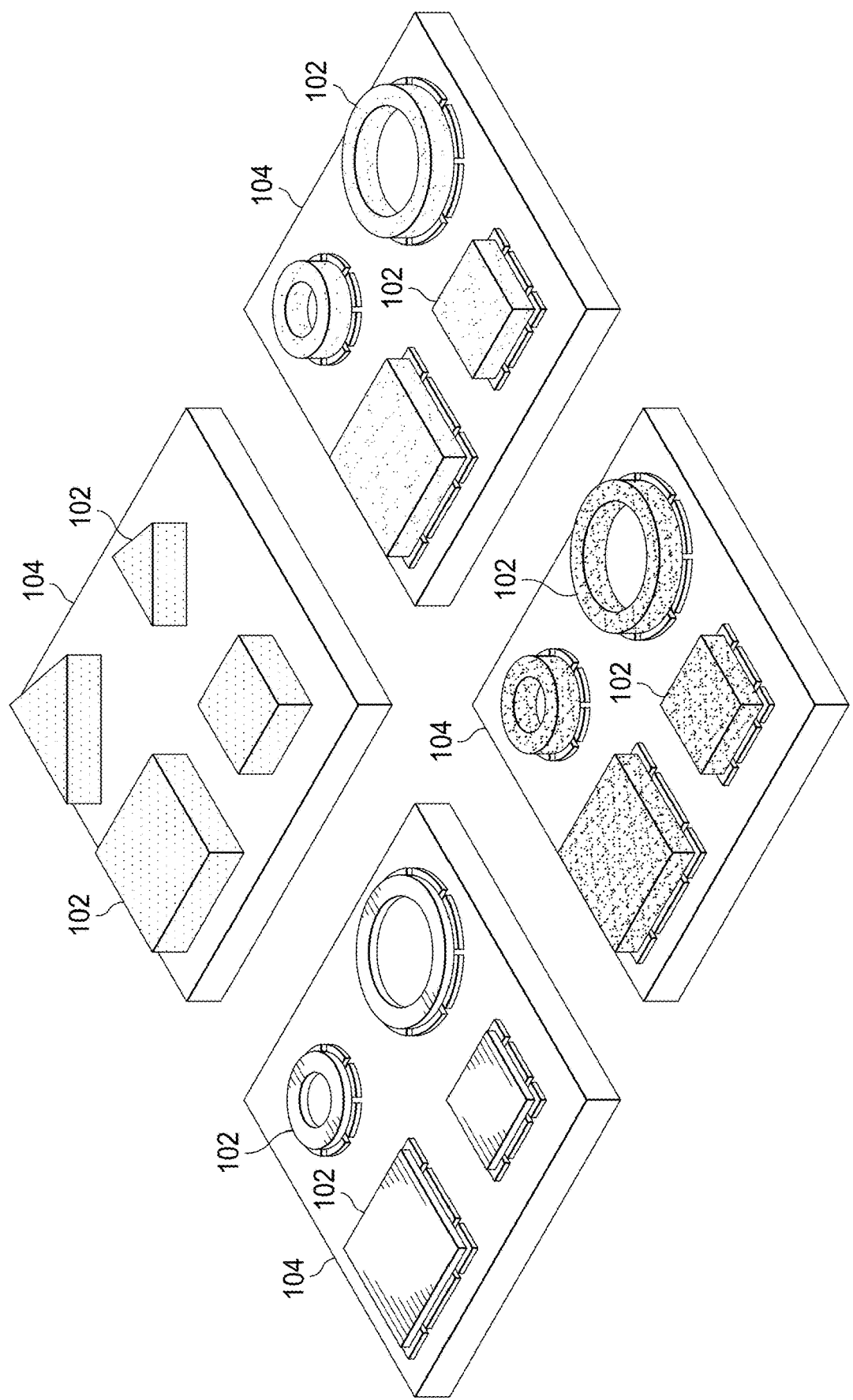
FIGS. 1A-1E are schematics of an exemplary microassembly process, including preparation of inks (specifically, solid-phase inks) on donor substrates (FIG. 1A); alignment and contacting of a stamp with an ink to achieve reversible binding (FIG. 1B); picking up of the ink (FIG. 1C); transferring of the ink to a receiving substrate (printing) (FIG. 1D); and thermal joining to form the microassembly (FIG. 1E).
Figure 1B:
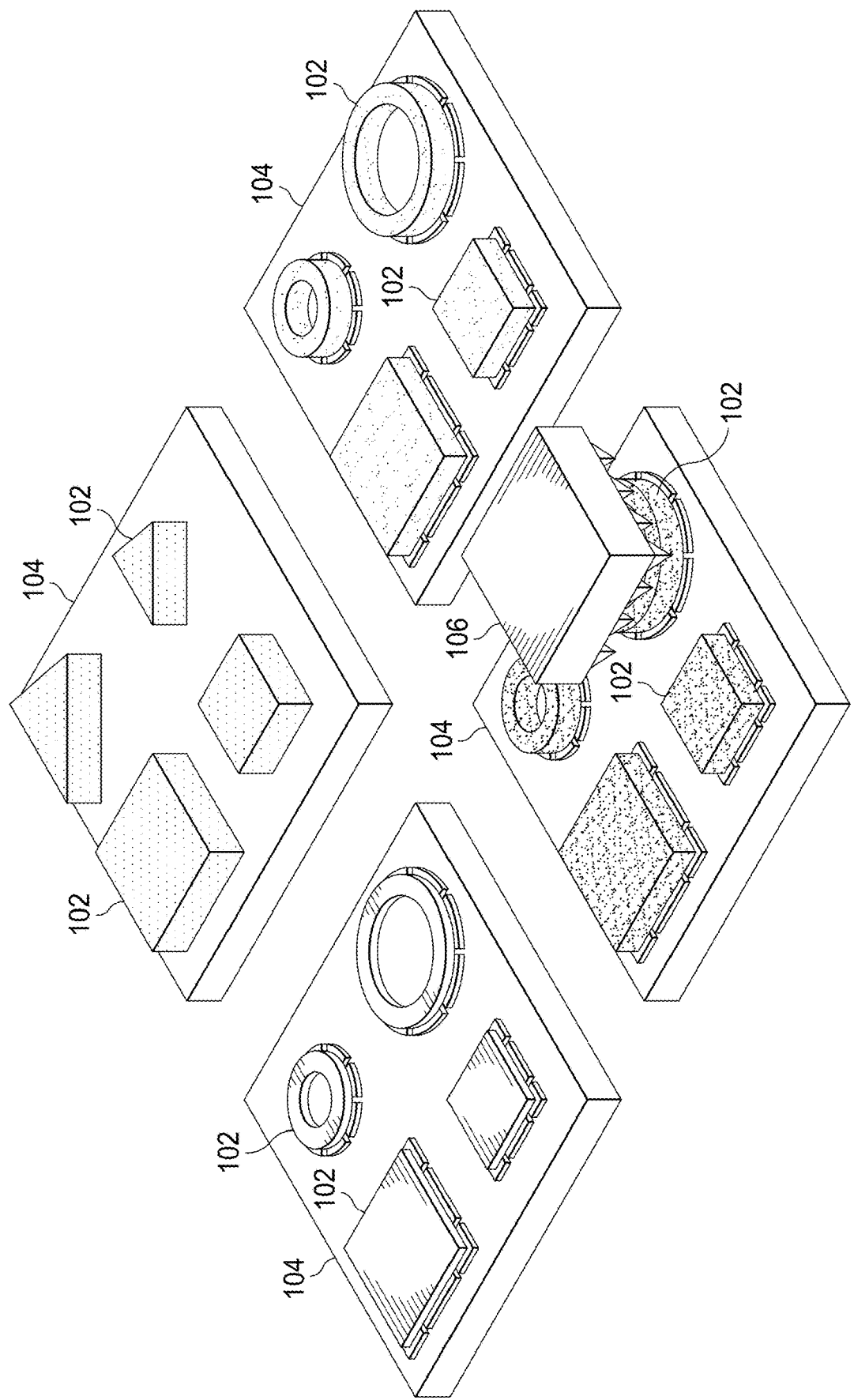
Figure 1C:
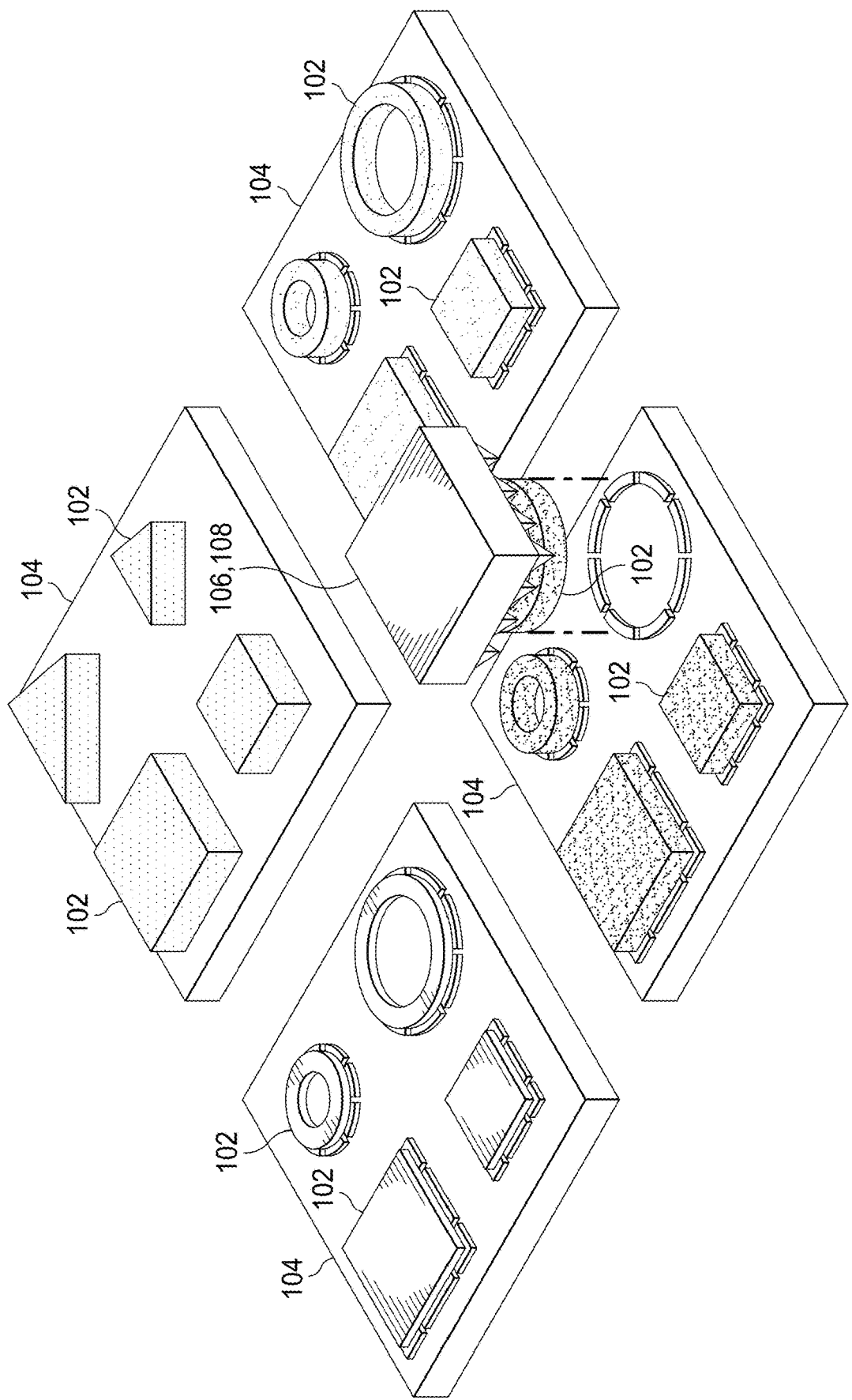
Figure 1D:
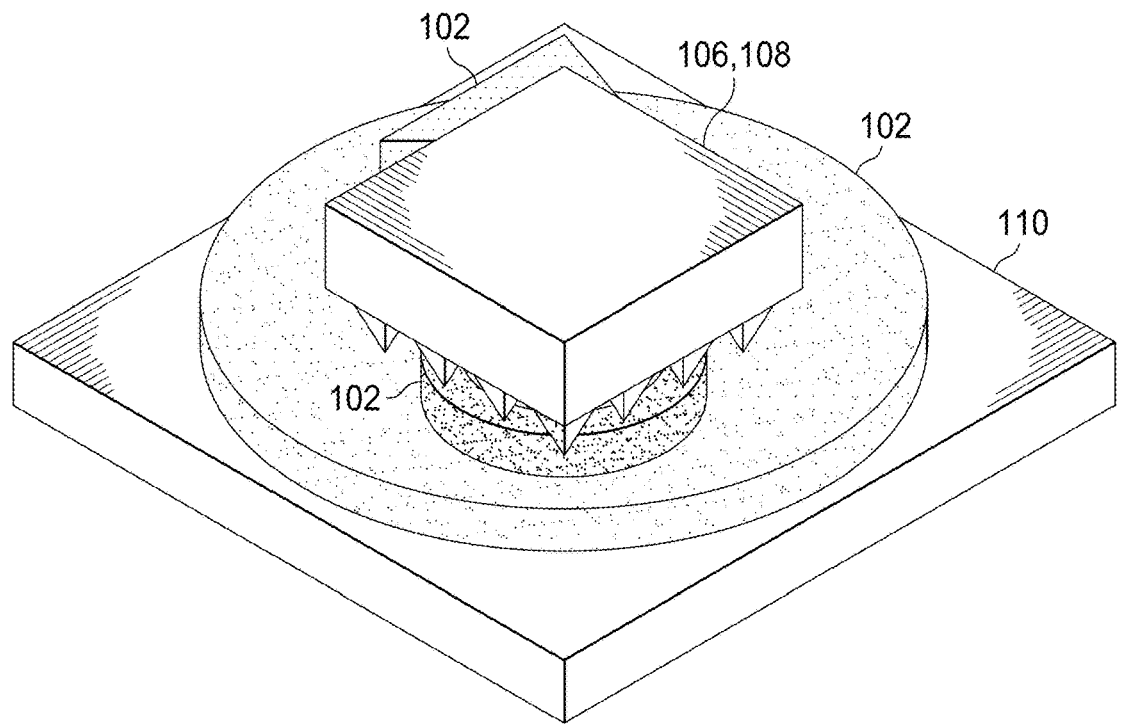
Figure 1E:
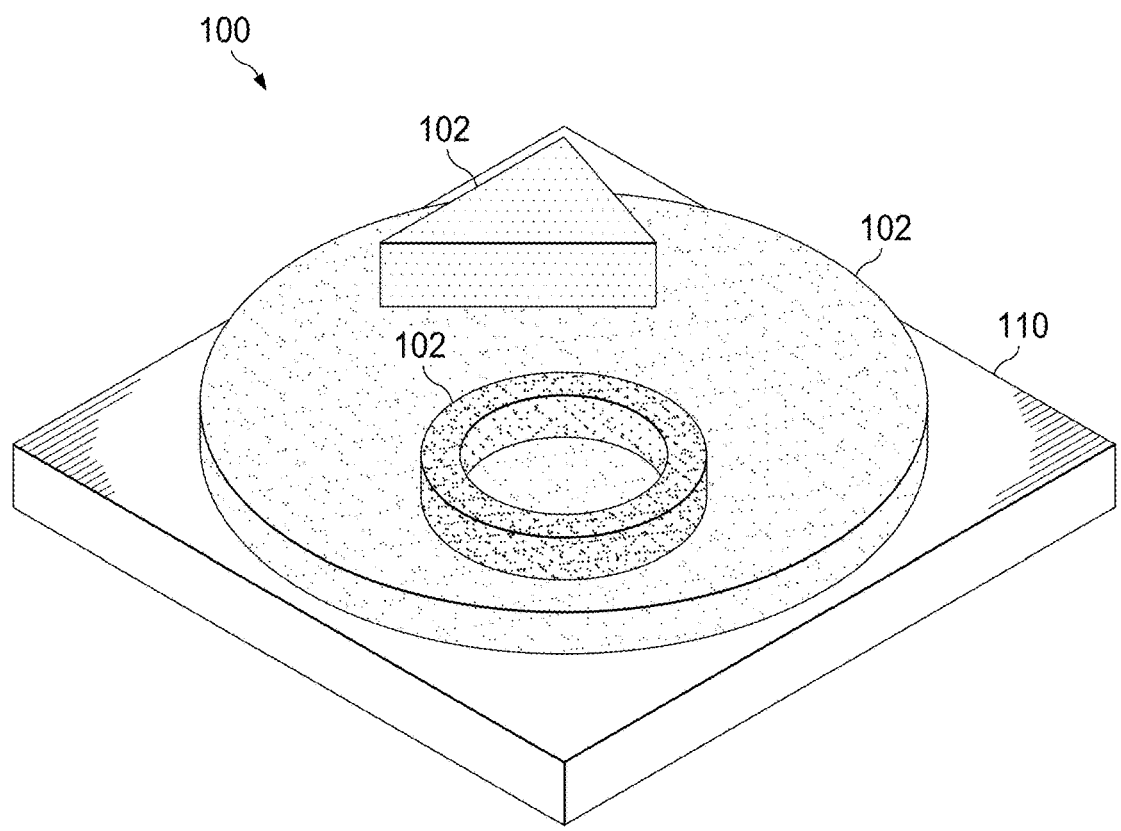

FIGS. 1A-1E schematically illustrates an exemplary microassembly process that can be divided into three sequential steps: preparing (FIG. 1A), transferring (FIGS. 1B-1D), and thermal joining of inks (FIG. 1E). The inks or ink materials prepared in this disclosure include Si, $SiO_2$, Au and an epoxy polymer (e.g., SU-8). One or more inks (e.g., a discrete ink or an array of inks) may be prepared for easy retrieval from a donor substrate during transfer printing, as described below in reference to FIGS. 4A-7F. An ink prepared on a donor substrate may be transferred onto a target area of a receiving substrate utilizing a stamp, such as a microtip stamp as illustrated in FIGS. 1B-1D and elsewhere in this disclosure, and as described in U.S. Pat. No. 9,412,727, which is hereby incorporated by reference in its entirety. The receiving substrate with the transferred ink is subsequently thermally processed to join the ink and the target area of the substrate by fusion, eutectic or adhesive bonding under appropriate conditions (e.g., see Table 1). This transferring and joining cycle may be repeated until a microassembly having a predetermined 3D structure is achieved, as shown for example in FIGS. 2A-2E. These exemplary 3D assembled structures realized from 2D inks at the microscale reveal unparalleled heterogeneous material assembly capabilities that can further be exploited in various applications.

Referring now to FIGS. 1A-1E, the method for microassembly of heterogeneous materials may include preparing an ink (or multiple inks) 102 on a donor substrate 104, as indicated in FIG. 1A, and contacting a stamp 106 with the ink 102, as shown in FIG. 1B, thereby forming an inked stamp 108, as shown in FIG. 1C. The ink 102 comprises a first material, such as Si, Au, $SiO_2$ or SU-8 or another polymer. The stamp 106 is capable of reversible binding of the ink 102.

The inked stamp 108 (i.e., the stamp 106 and the ink 102 reversibly bound to the stamp 106) is removed from the donor substrate 104, as illustrated in FIG. 1C, and aligned with a target area on a receiving substrate 110. The ink 102 may be printed directly onto the receiving substrate 110 or onto an object (e.g., a previously deposited ink 102) on the receiving substrate 110. The object and/or the receiving substrate 110 may comprise a second material different from the first material. The second material may be selected from silicon, gold, $SiO_2$ and/or SU-8 or another polymer. The ink 102 is stamped onto the object or the receiving substrate 110, as shown in FIG. 1D, and the stamp 106 is removed, thereby transferring the ink 102 to the receiving substrate 110. After transfer printing, the ink 102 and the object and/or receiving substrate 110 are heated to effect bonding (i.e., thermally joined), thereby forming a microassembly 100 of heterogeneous materials, as shown in FIG. 1E.

As indicated above, the stamp 106 is capable of reversibly binding the ink 102. More specifically, the stamp 106 may comprise a material that exhibits minimal adhesion to the ink 102; the adhesion is sufficient to allow for transportation of the ink 102 on the stamp 106 but also release of the ink 102 upon removal of the stamp 106 from the receiving substrate 110. For example, the stamp 106 may comprise a material with viscoelastic properties, such as polydimethylsiloxane (PDMS) or another polymer.

The method may further include repeating the contacting and stamping to add additional inks 102 to the receiving substrate 110. The microassembly 100 may include at least two of the inks 102 stacked on the receiving substrate 110, as shown schematically in FIG. 1E and in FIG. 2A. Depending on the arrangement of the inks 102, the microassembly 100, 200 may include an overhanging or suspended portion or another 3D geometry that is difficult or impossible to fabricate using conventional photolithographic patterning.

Figure 2A:
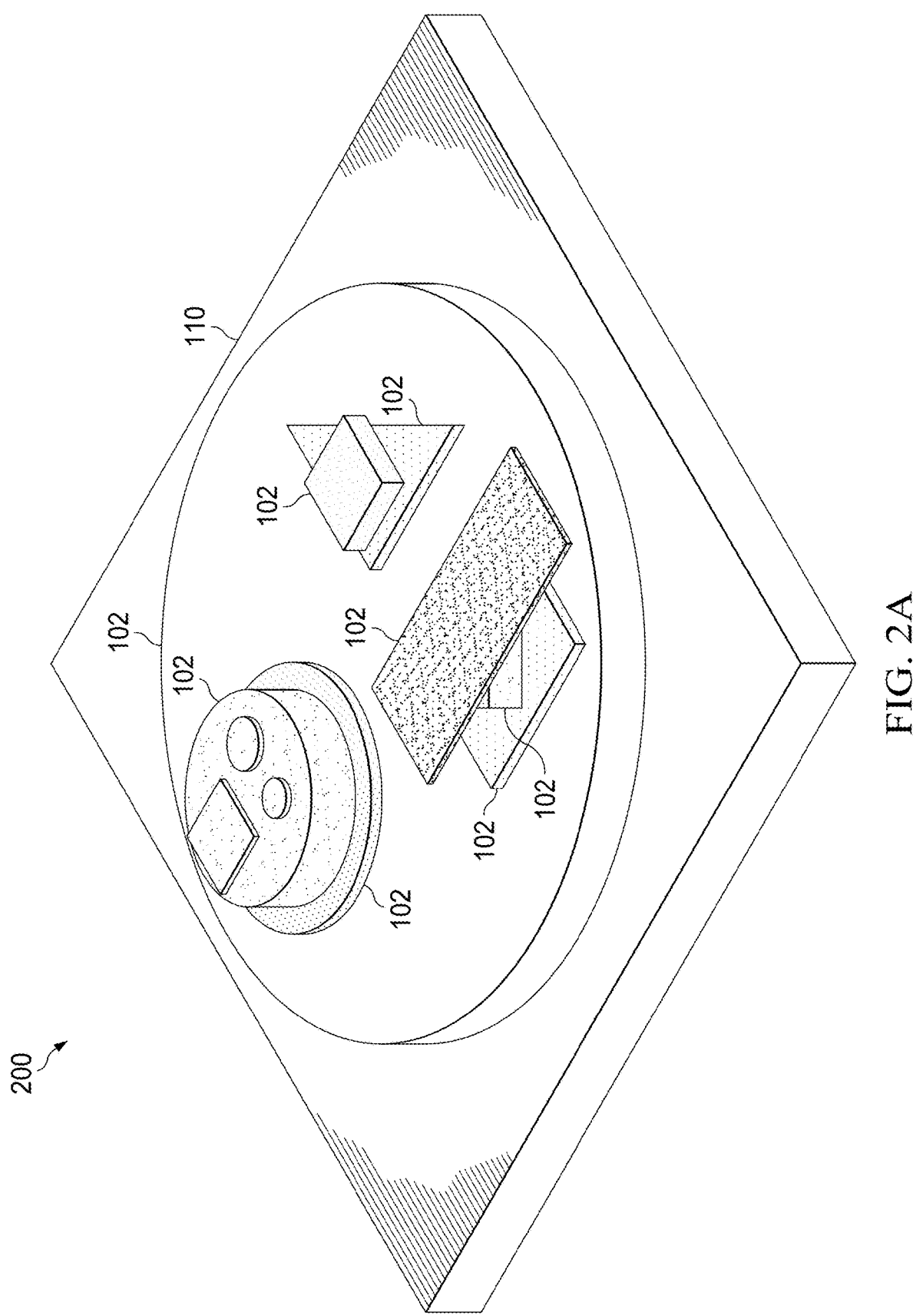
FIG. 2A is a schematic of an exemplary microassembly formed by individually transferring different inks onto target sites on a receiving substrate followed by thermal processing.
Figure 2C:
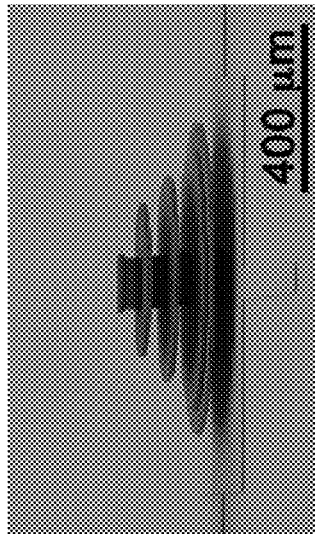
FIG. 2C shows a SEM image of a microassembly including multiple layer Si discs and SU-8 blocks.
Figure 2E:
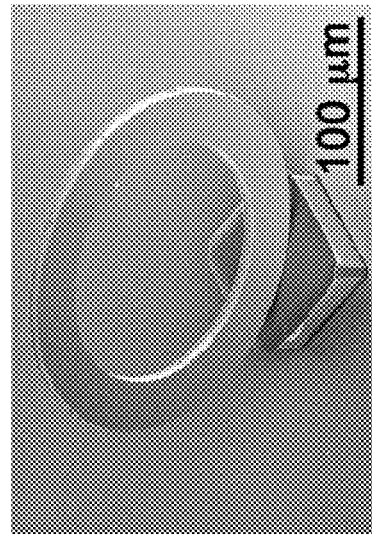
FIG. 2E shows a vertically aligned Si ring joined on a SU-8 block.
Figure 2B:
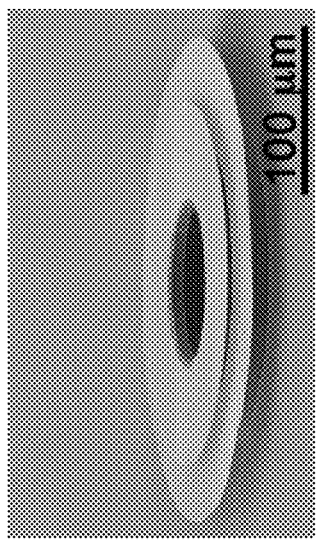
FIG. 2B shows a scanning electron microscope (SEM) image of a microassembly including double layer Si rings and $SiO_2$ discs.
Figure 2D:
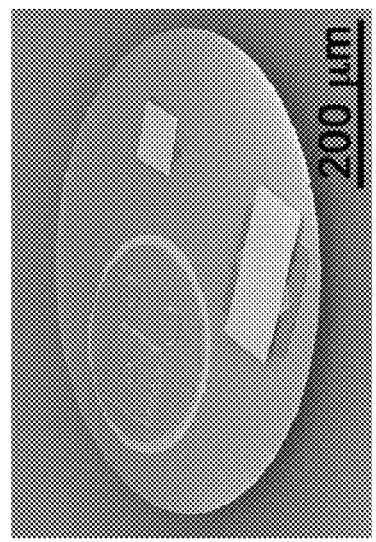
FIG. 2D shows a SEM image of the microassembly illustrated in FIG. 2A, which includes Si, $SiO_2$, Au, and SU-8 inks.

FIGS. 2B-2E are scanning electron microscopy (SEM) images of representative microassemblies formed by transfer printing and thermal joining; FIG. 2B shows a microassembly comprising double layer Si rings and $SiO_2$ discs; FIG. 2C shows a microassembly including multiple layer Si discs and SU-8 blocks; FIG. 2D shows a microassembly composed of Si, $SiO_2$, Au, and SU-8 inks of various shapes; and FIG. 2E shows a microassembly including a vertically aligned Si ring joined on a SU-8 block.

The repeating of the contacting and stamping to incorporate multiple inks 102 in the microassembly 100,200 (e.g., as shown in FIG. 2A) may be carried out prior to thermal joining; in other words, the thermal joining may take place in a single step after all of the inks 102 are placed in a predetermined arrangement on the receiving substrate 110. Alternatively, after thermally bonding the (first) ink 102 to the receiving substrate 110, the thermal joining may be repeated at suitable temperatures as additional inks 102 are stamped onto the receiving substrate 110, either directly onto the receiving substrate 110 or onto objects (such as previously deposited inks 102) on the receiving substrate 110. In other words, the thermal joining may be carried out in separate steps at different temperatures as additional inks 102 are printed. As would be recognized by the skilled artisan, the thermal joining may include ink-to-receiving substrate bonding and/or ink-to-ink bonding with the printing of additional inks 102. It is also worthwhile to note that the temperature of individual joining steps may be considered when the sequence of assembly and thermal joining is determined, since inks comprising materials such as SU-8 or Au may not be able to withstand the higher temperatures required for joining Si—Si or Si—$SiO_2$, for example.

Thus, the ink(s) 102 and the receiving substrate 110 may be thermally joined by heating at a suitable temperature determined in full or in part by the materials being joined. In one example, the first (ink) material comprises $SiO_2$ and the second (receiving substrate) material may be SU-8 or Si. In another example, the first material comprises SU-8 and the second material may be $SiO_2$, Si, and Au. Examples of thermal joining conditions for different ink-receiving substrate pairs are set forth in Table 1. The bonding mechanism depends on the materials and may be described as fusion, eutectic or adhesive bonding, as summarized in Table 2.

Generally speaking, thermal joining is carried out at a temperature in a range of about 125° C. to about 1000° C., about 150° C. to about 1000° C., about 300° C. to about 1000° C., or about 600° C. to about 1000° C. The thermal joining may take place at a temperature of at least about 125° C., at least about 150° C., at least about 300° C., at least about 500° C., at least about 600° C., or at least about 900° C., depending on the materials involved. The thermal joining temperature may also be no greater than 200° C., no greater than 400° C., no greater than 700° C., or no greater than 1100° C., depending on the materials involved. For example, a $SiO_2$ ink may be joined to a Si receiving substrate by heating at a temperature in a range from about 900° C. to 1100° C. If, however, the Si receiving substrate first undergoes activation with oxygen, thermal joining with the $SiO_2$ ink may be carried out at a lower temperature in a range from about 500° C. to about 700° C. In another example, the $SiO_2$ ink may be joined to a SU-8 receiving substrate by heating at a temperature in range from about 125° C. to about 175°

C. In yet another example, a SU-8 ink may be joined to a receiving substrate comprising Si, SiO₂ or Au by heating at a temperature in a range from about 125° C. to about 175° C. As would be recognized by the skilled artisan, the temperature ranges given above apply to the material pairs regardless of which is the ink and which is the receiving substrate.

TABLE 1

Exemplary joining conditions for construction of 3D microassemblies.

| Receiving substrate material | Ink material | Joining Condition (Examples) |
|---|---|---|
| Si | Si | Si ink is directly transfer printed onto a target Si surface and thermally processed in a furnace at 1000° C. for 10 min with 5 sec ramping. |
| Si | SiO₂ | For high temperature (1000° C.) joining, a SiO₂ ink is directly printed onto a Si surface and thermally processed in a furnace at 1000° C. for 10 min with 5 sec ramping. For lower temperature (600° C.) joining, a SiO₂ ink is first transfer printed onto a Si substrate, which undergoes O₂ descumming process (O₂ 20 sccm, 150 mTorr, 200 W, 5 min) to remove photoresist (PR) that covers the SiO₂ ink. The ink is then transfer printed onto an activated (O₂, 20 sccm, 150 mTorr, 100 W, 30 sec) Si surface. The substrate is then placed and thermally processed in a furnace at 600° C. for 10 min with 5 sec ramping. |
| Si | Au | The surface of Si is cleaned with HF for removal of native oxide layer followed with transfer printing of an Au ink. The Au ink is transfer printed within short period of time after the HF treatment. The transfer printed sample is then placed in a furnace and thermally processed at 365° C. for 10 min with 5 sec ramping. |
| Si | SU-8 | SU-8 ink is directly printed on a Si surface and thermally processed in a furnace at 150° C. for 10 min with 10 min ramping. |
| SiO₂ | Si | Si ink is directly printed onto a SiO₂ surface and thermally processed in a furnace at 1000° C. for 10 min with 5 sec ramping. |
| Au | Au | Au ink is printed onto a clean Au surface with a moderate pressure for more intimate contact. |
| SU-8 | Si, Au, SiO₂ | A desired ink is printed and thermally processed in a furnace at 150° C. for 10 min with 10 min ramping. |
| Si, Au, SiO₂ | SU-8 | SU-8 ink is printed on a receiving substrate and thermally processed in a furnace at 150° C. for 10 min with 10 min ramping. |

TABLE 2

Diverse joining mechanisms utilized for joining different material combinations

| Joining Materials | | Joining Techniques |
|---|---|---|
| Si | Si, SiO₂ | Fusion |
| Si | Au | Eutectic |
| Au | Au | Cold welding |
| SU-8 | Si, Au, SiO₂ | Adhesive |

Generally speaking, the heating may be carried out for 30 minutes or less, 20 minutes or less, 10 minutes or less, or five minutes or less, and typically for at least about 0.5 minute or at least about 1 minute to effect bonding. Typically, the heating/thermal joining is carried out for 5 to 15 minutes. The thermal joining may take place in air or a controlled environment, e.g., inert gas or vacuum.

An advantage of the method is that application of pressure is not required during thermal joining. In contrast, in wafer scale joining, two objects are brought into contact and exposed to a preload during heating to promote intimate contact. The process does not require external forces during thermal processing since typical inks are significantly smaller than wafers, such that intermolecular forces between inks are strong enough to maintain sufficient surface contact. These dominant intermolecular forces may originate from reduced defects present in the small contact area when compared to wafer-scale bonding areas.

To demonstrate the integrity of bonded interfaces, microassemblies formed by transfer printing and thermal joining are evaluated with blister testing as described below, Experimental assessment of the interfacial joining strength between printed inks/substrates can not only ensure the robustness of assemblies constructed through microassembly but also allow a comparison between various mechanisms to join different materials at the microscale. Blister tests have been successfully utilized to characterize the adhesion of thin films formed on Si substrates and are utilized in this disclosure for measuring the joining strength at Si—Si, Si—SiO₂, Si—Au and Si-SU-8 interfaces of the microassemblies.

FIGS. 3A and 3B show a procedure to make an exemplary Si ink for a blister test and its dimensions, respectively. The Si ink, which has the shape of a disc, is prepared on a donor substrate, transferred onto a receiving substrate (which may be Si or coated with SiO₂, Au or SU-8), and joined for hermetic sealing. The pressure inside a hermetically sealed microcavity 320, shown in FIG. 3B increases in a controlled manner using a syringe pump, which induces the delamination of an ink, a silicon ink in this example, from the rim structure on a receiving substrate at critical pressure that satisfies Griffith's fracture criterion:

$$G_c = G(p_c) = 0.625 p_c d_c \quad (1)$$

where $G_c$ is a function of material properties of the ink and the receiving substrate and is termed critical energy release rate or toughness, which indicates the material's resistance to fracture along any given path. Provided that the ink delaminates along the joining interface, the corresponding $G_c$ indicates the toughness of the joining. The energy release rate G, on the other hand, is a loading parameter indicating the driving force for fracture. For the specimen geometry here, G is simply a function of the applied pressure $p_c$ and the central deflection of the ink $d_c$. Finite element analysis (FEA) is conducted to determine $d_c$ that is a function of measured $p_c$, specimen dimensions and material properties. At the moment when the Si ink delamination occurs, G reaches the toughness $G_c$. Upon failure, the critical pressure $P_c$ is measured and the corresponding deflection $d_c$ is obtained through simulation, as shown in FIG. 3D. By combining the experimentally obtained Pc and simulated $d_c$ values, the critical energy release rate $G_c$ can be formulated.

A full description of blister test specimen fabrication, joining conditions and testing procedures is provided below in reference to FIGS. 10A-12.

Three specimens are tested per each joining material pair and the resultant $G_c$ are plotted in FIG. 3C with respect to their thermal processing temperatures. Two different joining conditions are investigated in both Si—SiO₂ and Si-SU-8 pairs to compare the optimal and as conducted cases (Table 3). FIG. 3C shows data of joining strength versus thermal processing temperature for the bonded material pairs, including Si to Si, Si to SiO₂, Si to surface treated SiO₂, Si to Au, Si to SU-8, and Si to acetone treated SU-8, as determined from the blister tests. The data show that the joining strength ranges from about 0.3 J/m² to 4.5 J/m², which is compatible with wafer scale Si—Si fusion-bonded joining strength. Remarkably, all joining strength data of FIG. 3C are similar to or higher than the toughness data for silicon wafer bonding measured elsewhere, although the joining here is achieved without external forces during thermal processing, in contrast to wafer bonding techniques. (There is one exception: the case of the Si—Au blister test specimen, where ~150 kPa of external pressure is applied during thermal processing to form hermetic sealing in the microcavity. Therefore, the measured joining strength at the Si—Au interface shown in FIG. 3C may be understood to be the upper bound of the actual joining strength.) FIG. 3D provides optical images of an assembled Si ink upon pressuring and FEA results where the ink is ruptured prior to delamination from the underneath Si rim, indicating that the measured value for a Si—Si pair in FIG. 3C is the lower bound of the actual joining strength.

While thermal processing conditions for material joining in microassembly may be inspired by conventional wafer bonding techniques, optimal wafer-scale thermal processing conditions do not necessarily apply to microassembly processes. For example, an assembled Si—SiO₂ structure may fail to retain its original structure after thermal processing because of different thermal expansion coefficients between Si and SiO₂. In this case, a relatively low thermal processing temperature (600° C.) in conjunction with oxygen plasma surface activation may be exercised in microassembly. To reproduce such a process for a blister test specimen, a SiO₂ coated receiving substrate may be activated using oxygen plasma followed by transfer printing and thermal processing. The test results yield 0.3 J/m², which is lower than for Si—SiO₂ pair joined at the temperature of 1000° C., but still on par with other known wafer-scale joining strength values. Similarly, the joining strength between Si and acetone-treated SU-8 is separately studied since SU-8 inks for microassembly are prepared by releasing SU-8 inks in acetone bath. As expected, the acetone treatment on SU-8 can reduce the joining strength in comparison with an unadulterated Si to SU-8 interface, but it is still on the same order of magnitude with all other obtained joining strength data. In summary, the joining strength data obtained through blister tests (as shown in FIG. 3C) strongly support the device level capabilities of the microassembly technique.

TABLE 3

Thermal processing conditions for joining Si inks to different receiving substrates.

| Receiving Surface Materials | Joining Conditions |
| --- | --- |
| Si | A Si ink is transfer printed and thermally processed in a furnace at 1000° C. for 10 min with 5 sec ramping. |
| SiO₂ | Condition 1: A Si ink is transfer printed and thermally processed in a furnace at 1000° C. for 10 min with 5 sec ramping.<br>Condition 2: A receiving SiO₂ surface is activated (O₂ 20 sccm, 150 mTorr, 100 W, 30 sec). Afterwards, a Si ink is transfer printed and thermally processed at 600° C. for 10 min with 5 sec ramping. |
| Au | Any native oxide on a Si ink is removed in a HF bath. The Si ink is transfer printed and thermally processed at 365° C. for 10 min with 5 sec ramping. |
| SU8 | Condition 1: A Si ink is directly transfer printed and thermally processed in a furnace at 150° C. for 10 min with 10 min ramping. |

TABLE 3-continued

Thermal processing conditions for joining Si inks to different receiving substrates.

| Receiving Surface Materials | Joining Conditions |
| --- | --- |
| | Condition 2: A SU8 receiving substrate is baked at 110° C. for 1 min followed with immersing in acetone bath for 1 min before thermal processing at 150° C. for 10 min with 10 |

The applications of microassembly are enhanced by the development of methods to fabricate SU-8 and SiO₂ as inks, as shown in FIGS. 6A-6D and FIGS. 7A-7F, respectively, FIGS. 4A-5F, which are discussed in the Examples below, illustrate fabrication of Si and Au inks. Each material can require a unique processing approach to successfully form an ink suitable for transfer printing.

Figure 7E:
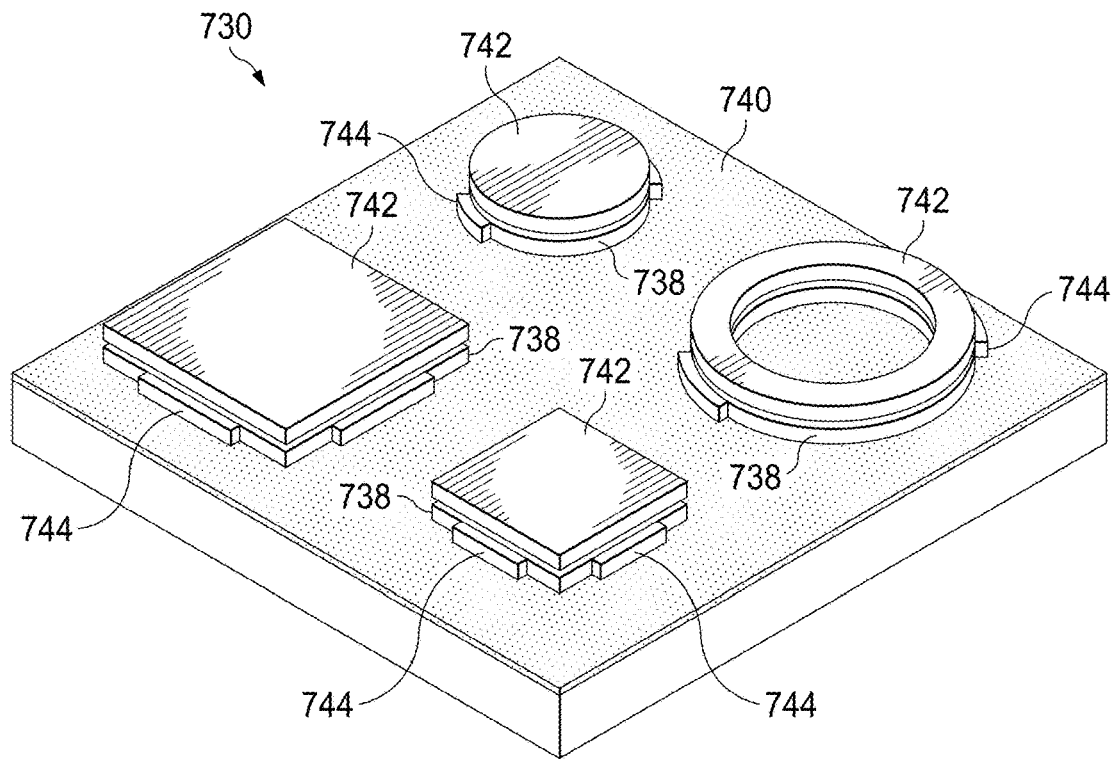

FIGS. 7A-7F illustrate an exemplary process flow of the SiO₂ ink. The process flow may begin with selection of a silicon on insulator (SOI) wafer 730, as shown in FIG. 7A, which undergoes thermal processing to grow a thermal oxide on the device layer 732. In order to establish a sufficient thickness of the thermal oxide as well as the underlying Si layer 732, which becomes a sacrificial layer, the device layer thickness of the SOI wafer may be carefully selected. As illustrated in FIG. 7B, the 501 wafer 730 is thermally oxidized to grow a desired thickness of SiO₂ 734 over the device layer 732. Growth of the thermal oxide 734 is followed by patterning of the oxide layer to form a SiO₂ ink pattern 736 on the silicon layer 732 (e.g., using reactive ion etching (RIE)), as indicated in FIG. 7C. After patterning the SiO₂ layer 734, the device (silicon) layer 732 of the SOI wafer 730 is removed, as illustrated in FIG. 7D, except for a portion laterally surrounding (and underlying) the previously patterned SiO₂. In other words, the silicon layer 732 is patterned to form a silicon pattern 738 laterally surrounding and underlying the SiO₂ ink pattern 736 and to expose a buried oxide layer 740 away from the SiO₂ ink pattern 736. Accordingly, the patterning of the silicon layer 732 is carried out with a pattern larger in lateral dimension than that employed to form the SiO₂ ink pattern 736, and may entail reactive ion etching. A layer of photoresist is then applied and patterned to form photoresist anchor(s) 744 tethering the photoresist 742 on the SiO₂ ink pattern 736 to the substrate 730, as shown in FIG. 7E. As can be seen, the SiO₂ ink pattern 736 is completely covered with (or conformally coated with) the photoresist 742 and the photoresist anchor(s) 744 extend to the buried oxide layer 740. Once the photoresist anchors 744 are formed, the silicon pattern 738 laterally surrounding and underlying the SiO₂ ink pattern 736 may be removed through xenon difluoride (XeF₂) isotopic etching, which results in suspended SiO₂ ink(s), which are present but not visible in FIG. 7F due to the overlying photoresist 742. The photoresist 742 and photoresist anchors 744 need not be removed prior to transfer printing and thermal joining of the SiO₂, although removal to uncover the SiO₂ ink(s) 746 can be carried out prior to transfer printing if desired.

SU-8 is processed to ink format as illustrated in FIGS. 6A-6D. The includes coating a sacrificial layer 650 onto a silicon substrate 652, as shown in FIG. 6A, and coating a polymeric material (e.g., an epoxy-based polymer such as SU-8) on the sacrificial layer 650 and curing to form a polymer layer 654, as shown in FIG. 6B. For example, a polymethyl methacrylate (PMMA) sacrificial layer 650 may be spin coated onto a silicon substrate 652, followed by spin coating and curing of a SU-8 polymer layer 654. The thickness of the SU-8 coated onto the substrate is determined by the desired thickness after microassembly. The polymer layer 654 is then patterned to form a polymeric ink pattern 656, as shown in FIG. 6C, where the patterning may include exposing the polymer layer to light through a pattern mask, baking after the exposing, and developing after the baking. Finally, the sacrificial layer 650 is removed by, for example, exposure to a solvent, thereby forming a polymeric (e.g., SU-8) ink 658 on the silicon substrate 652 for transfer printing. The removal may entail submersion of the sacrificial layer in an acetone bath. During this sacrificial removal step, it may be critical for the acetone bath to remain undisrupted since the polymeric ink is not anchored as is the $SiO_2$ ink described above; thus, the polymeric ink remains on the substrate due to mere surface interaction, which may be infinitesimally small to facilitate transfer printing using a stamp manipulator.

EXAMPLES

Microassembly Procedure

Si, Au, $SiO_2$ and SU-8 inks may be prepared on individual donor substrates as shown in FIGS. 4A-7F. FIGS. 8A-8E show an exemplary fabrication process of a stamp, as described below.

An exemplary donor substrate 104 including four inks 102 is shown in FIG. 9A. A microtip stamp 106 made of PDMS in this example is brought to contact with one of the inks 102 with high preload such that all microtips are fully collapsed, as shown in FIG. 9B. Rapid retrieval of the microtip stamp 106 allows the ink 102 to be separated from the donor substrate 104 and adhere to the microtip stamp 106 (forming inked stamp 108), as shown in FIG. 9C. Once the preload is removed, the stamp 106 returns to its original microtip configuration, which results in minimal adhesion between the retrieved ink 102 and the stamp 106 due to the reduced contact area. Subsequently, the stamp 106 with the ink 102 is delivered to a target area on a receiving substrate 110 (FIG. 9D) and brought to contact with the substrate 110 with minimal preload, as shown in FIG. 9E. The stamp 106 is then separated from the substrate 110 at low speed, which leaves the ink 102 on the target area of the receiving substrate 110 due to the stronger intermolecular interaction between the receiving substrate 110 and the ink 102, as shown in FIG. 9F. Following transfer printing of the ink 102, the receiving substrate 110 and the ink 102 are thermally processed (e.g., as described in Table 1) to join the ink 102 and the substrate 110.

Microassembly of Blister Test Specimens

Receiving substrates with rims covered or formed by four different materials are made as depicted in FIGS. 10A-10C. On a separate donor substrate, Si disc inks are fabricated and these inks are assembled on receiving substrates as illustrated in FIGS. 11A-11D. FIG. 12 describes the test setup where the hermetically sealed specimens are pressurized until the inks (e.g., Si disc inks) are delaminated or ruptured. The joining conditions are provided in Table 3.

Assembly Procedure of a Vertical Si Ring on a SU-8 Block

Si ring-shaped inks are prepared on a donor substrate and retrieved by a PDMS microtip stamp. On one side of the retrieved ring shaped ink, normal force is applied in a horizontal direction, which causes delamination of ink from the stamp and the ink is attached vertically on an adjacent side of the stamp. Afterwards, the vertically adhering ink is transferred and joined on an SU-8 block to form a 3D Si/SU-8 structure, as shown in FIG. 2E.

Si Ink Fabrication

1. Determine an SOI wafer based on top Si layer thickness requirement and buried oxide (BOX) layer of 1 µm (Ultrasil), as shown in FIG. 4A.

2. Pattern AZ 5214 photoresist (PR: AZ electronic materials) by first spinning at 3000 rpm for 30 seconds, followed with soft baking at 110° C. for 1 minute. Once the PR is soft baked, expose using I-line UV (Karl Suss MJB 3) for the dose of 130 $mJ/cm^2$ and develop using 917 MIF developer (AZ electronic materials) for approximately 20 seconds.

3. Pattern Si device layer using reactive ion etching (RIE: PlasmaTherm: 40 sccm SF6, 50 mTorr, 100 W, 3 minutes), as shown in FIG. 4B.

4. Remove photoresist masking layer and pattern second mask pattern using AZ 5214 PR for selective undercut protection. Identical procedure as step 2 is used for patterning the PR.

5. Post exposure bake at 110° C. for 60 seconds, as shown in FIG. 4C.

6. Place the substrate in 49% Hydrofluoric Acid (HF: Sigma-Aldrich) for 55 seconds, as shown in FIG. 4D.

7. Remove photoresist and construct AZ 5214 PR anchor through identical procedure as in step 2, as shown in FIG. 4E. Since the PR anchors remain only the undercut-etched region, mask pattern is unnecessary. Flood exposure (ABM Flood Exposure Model 60) is used in this case with same dosage as in step 2.

8. Post exposure bake of the PR anchors at 110° C. for 90 seconds.

9. Leave the substrate for sufficient time in 49% HF bath for complete removal of BOX layer underneath the Si pattern, as indicated in FIG. 4F.

Au Ink Fabrication

1. An Si wafer (University wafer) is placed inside furnace to grow ~1 µm of thermal oxide layer (Lindberg Hevi-Duty Lancer M-300) at 1100° C. with 6 sccm $O_2$ for 48 hours.

2. 5 nm of Ti and 400 nm of Au are sputter (AJA ATC ORION 8HV) deposited (20 sccm Ar, $5 \times 10^{-3}$ Torr, 300 W, 1 min for Ti and 20 min for Au), as indicated in FIG. 5A.

3. Pattern AZ 5214 photoresist (PR: AZ electronic materials) by first spinning at 3000 rpm for 30 seconds, followed with soft baking at 110° C. for 1 minute. Once the PR is soft baked, expose using I-line UV (Karl Suss MJB 3) for the dose of 130 $mJ/cm^2$ and develop using 917 MIF developer (AZ electronic materials) for approximately 20 seconds.

4. Post exposure bake at 110° C. for 1 minute.

5. Place the PR patterned substrate in Au etchant (Sigma-Aldrich) for approximately 2 minutes to pattern Au followed with PR removal, as indicated in FIG. 5B.

6. Pattern second mask pattern using AZ 5214 PR for selective undercut protection. Identical procedure as step 2 is used.

Figure 5C:
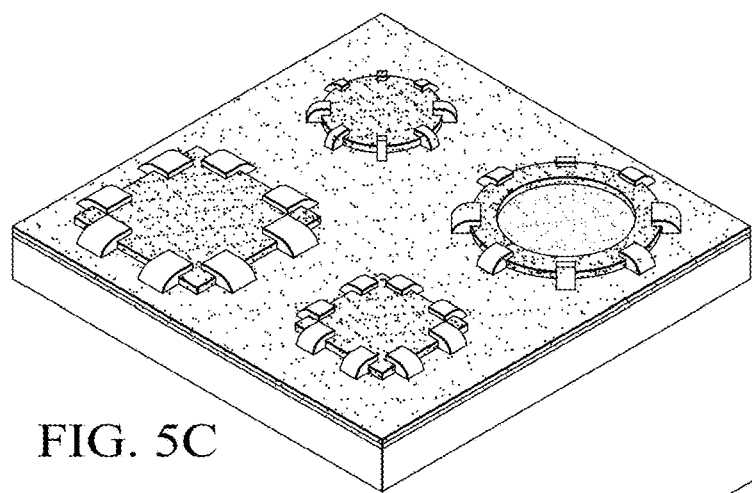

7. Post exposure bake at 110° C. for 60 seconds, as shown in FIG. 5C.

Figure 5D:
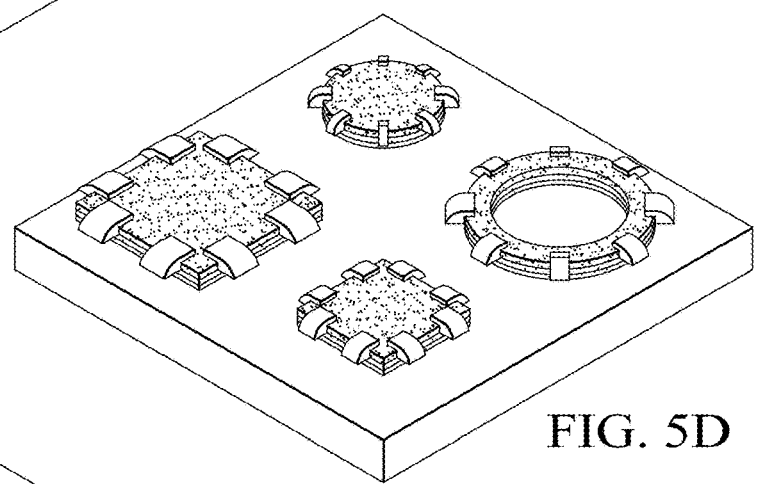

8. Place the substrate in 49% Hydrofluoric Acid (HF: Sigma-Aldrich) for 55 seconds, as indicated in FIG. 5D.

Figure 5E:
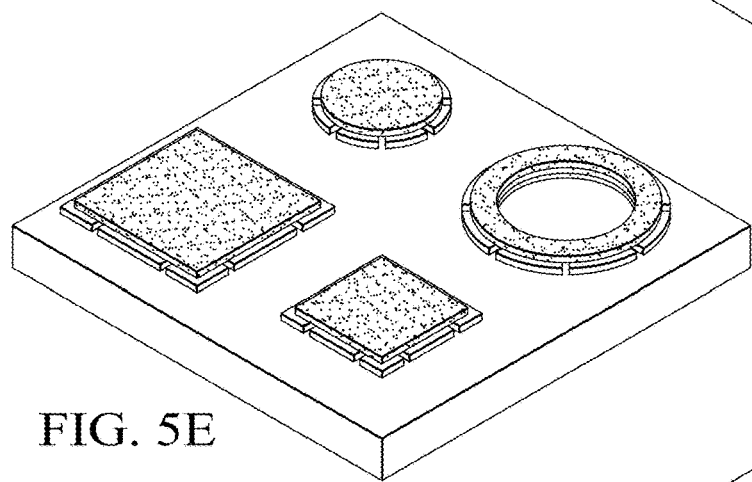

9. Remove photoresist and construct AZ 5214 PR anchor through identical procedure as in 2, as indicated in FIG. 5E. Since the PR anchors remain only the undercut-etched region, mask pattern is unnecessary. Therefore, flood exposure (ABM Flood Exposure Model 60) is used in this case with same dosage as in step 2.

10. Post exposure bake of the PR anchors at 110° C. for 90 seconds.

Figure 5F:
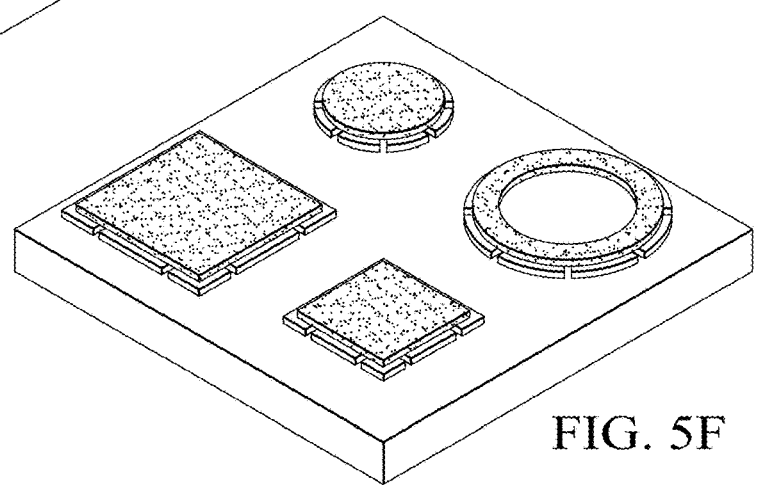

11. Leave the substrate for sufficient time in 49% HF bath for complete removal of buried oxide and Ti sacrificial layer underneath the Au pattern, as indicated in FIG. 5F.

SU-8 Ink Fabrication

1. Spin coat 495 poly(methylmethacrylate) A resist with 6% in Anisole (PMMA: Microchem) at 3000 rpm and soft bake at 180° C. for 1 minutes, as shown in FIG. 6A.

2. Spin coat SU8-50 (Microchem) at 3000 rpm and soft bake on hot plate for 65° C. for 6 minutes and 95° C. for 20 minutes, as indicated in FIG. 6B.

3. Using H-line flood exposure (ABM Flood Exposure Model 60), expose SU8-50 through a pattern mask for 200 mJ/cm$^2$.

4. Post exposure bake at 65° C. for 1 minutes and 95° C. for 5 minutes.

5. Develop using SU-8 developer for 6-10 minutes (MicroChem), as shown in FIG. 6C.

Submerge the substrate in acetone bath for 1 min for complete removal of PMMA sacrificial layer, as indicated in FIG. 6D.

SiO$_2$ Ink Fabrication

1. An SOI wafer (Ultrasil) with device layer with 1.5 μm (FIG. 7A) is placed inside furnace to grow ~1 μm of thermal oxide layer (Lindberg Hevi-Duty Lancer M-300) at 1100° C. with 6 sccm O$_2$ for 48 hours, as shown in FIG. 7B.

2. Pattern AZ 5214 photoresist (PR: AZ electronic materials) by first spinning at 3000 rpm for 30 seconds, followed with soft baking at 110° C. for 1 minute. Once the PR is soft baked, expose using I-line UV (Suss MJB 3) for the dose of 130 mJ/cm$^2$ and develop using 917 MIF developer (AZ electronic materials) for approximately 20 seconds.

3. Post exposure bake at 110° C. for 1 minute.

4. Place the substrate in 49% HF (Sigma-Aldrich) for 55 seconds, as indicated in FIG. 7C.

5. Remove PR masking layer and Pattern AZ 5214 PR for device layer patterning following the identical procedure as in step 2. This second PR pattern is designed to be approximately 10% larger in lateral dimension than previous oxide pattern in order to protect SiO$_2$ layer during RIE process.

6. Pattern Si device layer using reactive ion etching (RIE: PlasmaTherm: 40 sccm SF$_6$, 50 mTorr, 100 W, 3 minutes) and remove PR, as indicated in FIG. 7D.

7. Construct AZ 5214 PR anchor using the identical procedure as in step 2. The pattern needs to completely cover patterned thermally grown SiO$_2$ layer as well as some anchors that extends out to buried oxide layer, as shown in FIG. 7E.

Figure 7F:
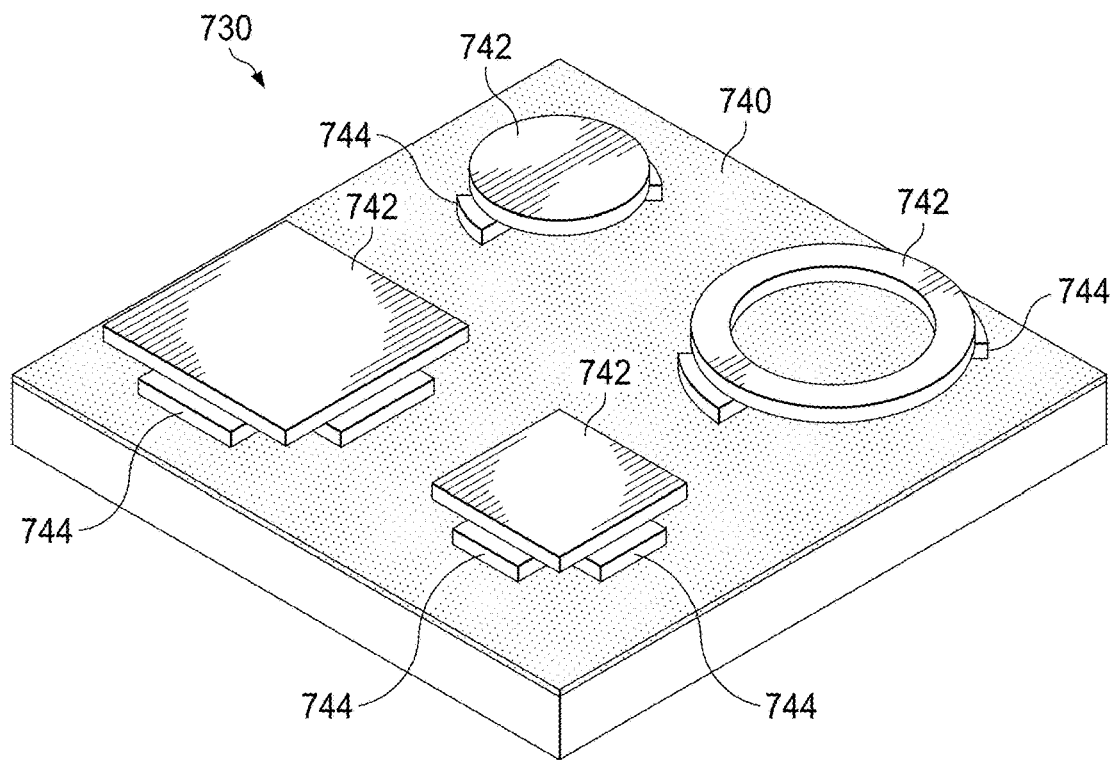

8. Place the substrate in XeF$_2$ etcher (Xactix) for 30 cycles that runs 3 Torr XeF$_2$, 50 seconds per cycle for complete removal of Si device layer that served as sacrificial layer, as indicated in FIG. 7F.

Elastomeric Microtip Stamp Fabrication

1. On {100} Si substrate (University Wafer), deposit 50 nm of Si$_3$N$_4$ using PECVD (STS systems USA Inc) with medium frequency (1960 sccm N$_2$, 40 sccm SiH$_4$, 35 sccm NH$_3$, 650 mTorr, 300° C. platen and 240° C. showerhead temperatures, 13.56 MHz 20 W 6 seconds and 380 KHz, 20 W 2 seconds per cycle, total of 37 cycles).

2. Pattern AZ 5214 photoresist (PR: AZ electronic materials) by first spinning at 3000 rpm for 30 seconds, followed with soft baking at 110° C. for 1 minute. Once the PR is soft baked, expose using I-line UV (Suss MJB 3) for the dose of 130 mJ/cm$^2$ and develop using 917 MIF developer (AZ electronic materials) for approximately 20 seconds.

3. Post exposure bake at 110° C. for 1 min.

4. Etch Si$_3$N$_4$ using 10:1 buffered oxide etchant (BOE: Sigma-Aldrich) by submerging the substrate in the BOE bath for 150 seconds and remove AZ 5214 PR, as indicated in FIG. 8A.

5. Place the substrate in potassium hydroxide (KOH: Fisher Scientific), isopropyl alcohol (IPA: Fisher Scientific) and deionized water (DI) mixture bath (70 g KOH, 70 ml IPA and 170 ml DI).

6. Place the KOH bath on 80° C. hot plate for ~4 hours.

7. Remove the Si$_3$N$_4$ masking layer by submerging in HF (Sigma-Aldrich) bath for 150 seconds, as indicated in FIG. 8B.

8. Spin coat SU8-50 (Microchem) at 3000 rpm and soft bake on hot plate for 65° C. for 6 minutes and 95° C. for 20 minutes.

9. Using H-line flood exposure (ABM Flood Exposure Model 60), expose SU8-50 through a pattern mask for 200 mJ/cm$^2$.

10. Post exposure bake at 65° C. for 1 minutes and 95° C. for 5 minutes.

11. Develop using SU-8 developer for 6-10 minutes (MicroChem).

12. Place the substrate vertically inside desiccator and apply 3-5 droplets of (Tridencafluoro-1,1,2,2-Tetrahydrooctyl)-1-Trichlorosilane (Trichlorosilane: United Chemical Technology) inside the desiccator.

13. Leave the substrate for 1 hour in vacuum. A monolayer of trichlorosilane is deposited on the surface of the Si/SU-8 substrate as shown in FIG. 8C.

14. Mix polydimethylsiloxane (PDMS: Sylguard 184, Dow Corning) pre-polymer base and cross-linking agent at 5:1 ratio.

15. Stir the mixture thoroughly and place the mixture inside a vacuum jar for 30 minutes. This step removes any micro scale bubbles that can be trapped inside the mixture.

16. Slowly pour the PDMS mixture over Si/SU-8 substrate.

17. Cure the PDMS by placing the substrate inside 70° C. oven for 2 hours, as indicated in FIG. 8D.

18. Slowly peel off the PDMS, as indicated in FIG. 8E, and remove the excessive PDMS using razor blade if necessary.

Transfer Printing Using Elastomeric Microtip Stamp

1. Prepare inks with desired material and dimensions, as shown in FIG. 9A, following procedures described above.

2. Align microtip elastomeric stamp fabricated as described above with a target ink that will be transferred.

3. Apply a preload such that all microtips are fully collapsed resulting increased surface contact area, as indicated in FIG. 9B.

4. Rapidly retract the elastomeric microtip stamp for ink pick up, as indicated in FIG. 9C. The removed preload causes the microtips to restore to original configuration that results reduced contact area between stamp and the retrieved ink.

5. Transfer the ink to desired receiving site as indicated in FIG. 9D.

6. Contact the ink with the receiving site using marginal preload, as shown in FIG. 9E.

7. Raise the stamp slowly, as shown in FIG. 9F, such that the ink is printed on substrate.

Blister Test Receiving Substrate Fabrication

I. Si Receiving Substrate, as Illustrated in FIG. 10A:

1. Deposit 200 nm of SiO$_2$ using PECVD (PlasmaTherm) on Si wafer.

2. Pattern SiO$_2$ layer to ring shape by photolithography, RIE etching (Axic), 40 sccm CF$_4$, 200 W, 35 mTorr, 20 minutes), and photoresist stripping.

3. Pattern a 100 μm square via hole opening by photolithography, etch through the wafer by DRIE (STS Pegasus DRIE, C4F8 200 sccm, 100 mTorr, 2000 W coil power for 4 sec passivation step, SF$_6$ 450 sccm and O$_2$ 45 sccm, 100 mTorr, 2800 W coil power, 40 W platen power for 7 sec etch step), and strip photoresist.

4. Etch silicon using DRIE with oxide mask on (STS Pegasus DRIE).

5. Dip the silicon substrate into hydrofluoric acid to remove SiO$_2$ mask.

6. Cleave the wafer into chips.

II. Au and SiO$_2$ Receiving Substrates, as Illustrated in FIG. 10B

1. Both Au and SiO$_2$ begin with a Si receiving substrate prepared as described above.

2. For Au receiving sample, 400 nm Au is sputter (AJA ATC ORION 8HV) deposited (20 sccm Ar, 5×10$^{-3}$ Torr, 300 W, 20 min for Au).

3. For SiO$_2$ receiving substrate, the Si receiving substrate is placed inside furnace (Lindberg Hevi-Duty Lancer M-300) at 1100° C. with 6 sccm O$_2$ for 24 hours to thermally grow 700 nm of SiO$_2$.

III. SU-8 Receiving Substrate, as Illustrated in FIG. 10C

1. Via hole is constructed using DRIE (STS Pegasus DRIE).

2. Spin coat SU8-50 (Microchem) at 3000 rpm and soft bake on hot plate for 65° C. for 6 minutes and 95° C. for 20 minutes.

3. Using i-line flood exposure UV lithography (Karl Suss MJB3 mask aligner), expose SU8-50 through a pattern mask for 200 mJ/cm$^2$.

4. Post exposure bake at 65° C. for 1 minutes and 95° C. for 5 minutes.

5. Develop using SU-8 developer for 6-10 minutes (MicroChem).

TABLE 4

Summary of joining rim dimensions and joining surfaces.

| Material | Joining Rim Inner Diameter (microns) | Joining Rim Outer Diameter | Joining Surface |
|---|---|---|---|
| Si receiving surface | 600 | 800 | Si rim |
| Au-coated receiving surface | 600 | 800 | 400 nm-thick Au |
| SiO$_2$-grown receiving surface | 600 | 800 | 700 nm-thick oxide |
| SU8-patterned receiving surface | 600 | 800 | 40 micron-thick SU8-50 |

Blister Test Specimen Assembly Via Micro-Lego

1. Prepare 3 μm thick, 900 μm diameter Si ink and microtip stamp following the procedures described above.

2. Bring the Si ink and the stamp together with high preload and rapidly raise the stamp to retrieve the Si disc ink, as shown in FIG. 11A.

3. Transfer the Si ink onto a receiving substrate prepared as described above, as shown in FIG. 11B.

4. Print the ink with precision, as indicated in FIG. 11C.

5. Thermally process the specimen for hermetic joining throughout the contact area, as shown in FIG. 11D.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method for microassembly of heterogeneous materials, the method comprising:
    contacting a stamp with a solid-phase ink disposed on a donor substrate to form an inked stamp, where the solid-phase ink is reversibly bound to the stamp;
    stamping the inked stamp onto a receiving substrate or onto an object on the receiving substrate, wherein the solid-phase ink comprises a first material and the receiving substrate or the object comprises a second material different from the first material;
    removing the stamp, thereby transferring the solid-phase ink to the receiving substrate; and
    thermally joining the solid-phase ink with the receiving substrate or the object, thereby forming a microassembly of heterogeneous materials,
    wherein the first material comprises SU-8 and the second material is selected from the group consisting of: SiO$_2$, Si, and Au.

2. The method of claim 1, further comprising repeating the contacting and stamping to add additional solid-phase inks to the receiving substrate.

3. The method of claim 1, wherein the stamp comprises a material with viscoelastic properties.

4. The method of claim 1, wherein the object comprises a previously deposited solid-phase ink.

5. The method of claim 1, wherein the thermal joining comprises a method selected from the group consisting of: fusion bonding, eutectic bonding and adhesive bonding.

6. The method of claim 1, wherein the thermal joining takes place at a temperature in a range from about 150° C. to about 1000° C.

7. The method of claim 1, wherein no external pressure is applied during the thermal joining.

8. The method of claim 1, wherein an interface between the solid-phase ink and the receiving substrate or the solid-phase ink and the object exhibits a joining strength in a range from about 0.3 J/m$^2$ to about 4.5 J/m$^2$.

9. The method of claim 1, further comprising fabricating the solid-phase ink on the donor substrate.

10. A method for microassembly of heterogeneous materials, the method comprising:
    fabricating a solid-phase ink comprising a polymer on a donor substrate, wherein the fabricating comprises:
        coating a sacrificial layer onto a silicon substrate;
        coating a polymeric material on the sacrificial layer and curing to form a polymer layer;
        patterning the polymer layer to form a polymeric ink pattern; and
        removing the sacrificial layer, thereby forming the solid-phase ink comprising the polymer for transfer printing;
    contacting a stamp with the solid-phase ink disposed on the donor substrate to form an inked stamp, where the solid-phase ink is reversibly bound to the stamp;

stamping the inked stamp onto a receiving substrate or onto an object on the receiving substrate, wherein the receiving substrate or the object comprises a material different from the polymer;

removing the stamp, thereby transferring the solid-phase ink to the receiving substrate; and thermally joining the solid-phase ink with the receiving substrate or the object, thereby forming a microassembly of heterogeneous materials.

11. The method of claim 10, wherein the sacrificial layer comprises polymethylmethacrylate (PMMA), and wherein the polymeric material comprises an epoxy-based polymer.

12. The method of claim 10, wherein the polymeric material comprises SU-8, and wherein the patterning comprises exposing the polymer layer to light through a pattern mask, baking after the exposing, and developing after the baking, thereby forming the polymeric ink pattern.

13. The method of claim 10, wherein the sacrificial layer is removed by exposure to a solvent.

14. A method for microassembly of heterogeneous materials, the method comprising:

fabricating a solid-phase ink comprising $SiO_2$ on a donor substrate wherein the fabricating comprises:

growing a $SiO_2$ layer on a silicon layer;

patterning the $SiO_2$ layer to form a $SiO_2$ ink pattern on the silicon layer;

patterning the silicon layer to form a silicon pattern laterally surrounding and underlying the $SiO_2$ ink pattern, thereby exposing a buried oxide layer away from the $SiO_2$ ink pattern;

covering the $SiO_2$ ink pattern with photoresist and forming one or more photoresist anchors to the buried oxide layer; and removing the silicon pattern, thereby forming the solid-phase ink comprising $SiO_2$ for transfer printing;

contacting a stamp with the solid-phase ink disposed on the donor substrate to form an inked stamp, where the solid-phase ink is reversibly bound to the stamp;

stamping the inked stamp onto a receiving substrate or onto an object on the receiving substrate, wherein the receiving substrate or the object comprises a material different from the $SiO_2$;

removing the stamp, thereby transferring the solid-phase ink to the receiving substrate; and thermally joining the solid-phase ink with the receiving substrate or the object, thereby forming a microassembly of heterogeneous materials.

15. The method of claim 14, wherein the patterning of the silicon layer is carried out with a mask pattern larger in lateral dimension than that employed to form the $SiO_2$ ink pattern.

16. The method of claim 14, wherein the patterning of the silicon layer comprises using reactive ion etching.

17. The method of claim 14, wherein a silicon-on-insulator wafer comprises the silicon layer and the buried oxide layer.

* * * * *